(12) United States Patent
Xu et al.

(10) Patent No.: US 12,166,094 B2
(45) Date of Patent: Dec. 10, 2024

(54) MICROELECTRONIC DEVICES WITH ACTIVE SOURCE/DRAIN CONTACTS IN TRENCH IN SYMMETRICAL DUAL-BLOCK STRUCTURE, AND RELATED SYSTEMS AND METHODS

(71) Applicant: Micron Technology, Inc., Boise, ID (US)

(72) Inventors: Lifang Xu, Boise, ID (US); Richard J. Hill, Boise, ID (US); Indra V. Chary, Boise, ID (US); Lars P. Heineck, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 307 days.

(21) Appl. No.: 17/373,258

(22) Filed: Jul. 12, 2021

(65) Prior Publication Data
US 2023/0010799 A1 Jan. 12, 2023

(51) Int. Cl.
*H01L 29/417* (2006.01)
*H01L 21/768* (2006.01)
(Continued)

(52) U.S. Cl.
CPC .. *H01L 29/41741* (2013.01); *H01L 21/76802* (2013.01); *H01L 21/76877* (2013.01); *H01L 23/528* (2013.01); *H01L 29/401* (2013.01)

(58) Field of Classification Search
CPC ......... H01L 29/41741; H01L 21/76802; H01L 21/76877; H01L 23/528; H01L 29/401; H10B 43/10; H10B 43/50
See application file for complete search history.

(56) References Cited

U.S. PATENT DOCUMENTS 9,589,978 B1 3/2017 Yip
9,779,948 B1 10/2017 Baraskar et al.
(Continued)

FOREIGN PATENT DOCUMENTS

KR 10-2020-0057936 A 5/2020

OTHER PUBLICATIONS

Moyer et al., "How It's Built: Micron/Intel 3D NAND, Micron Opens the Veil a Little", Electronic Engineering Journal, Feb. 2016, 9 pages.
(Continued)

*Primary Examiner* — Bac H Au
(74) *Attorney, Agent, or Firm* — TraskBritt

(57) ABSTRACT

Microelectronic devices include a tiered stack having vertically alternating insulative and conductive structures. A first series of stadiums is defined in the tiered stack within a first block of a dual-block structure. A second series of stadiums is defined in the tiered stack within a second block of the dual-block structure. The first and second series of stadiums are substantially symmetrically structured about a trench at a center of the dual-block structure. The trench extends a width of the first and second series of stadiums. The stadiums of the first and second series of stadiums have opposing staircase structures comprising steps at ends of the conductive structures of the tiered stack. Conductive source/drain contact structures are in the stack and extend substantially vertically from a source/drain region at a floor of the trench. Additional microelectronic devices are also disclosed, as are methods of fabrication and electronic systems.

29 Claims, 24 Drawing Sheets

(51) Int. Cl.
*H01L 23/528* (2006.01)
*H01L 29/40* (2006.01)

(56) References Cited

U.S. PATENT DOCUMENTS

| | | | |
|---|---|---|---|
| 10,373,970 B2 | 8/2019 | Lee | |
| 10,879,175 B2 | 12/2020 | Tessariol et al. | |
| 10,910,395 B2 | 2/2021 | Lee | |
| 10,978,478 B1 | 4/2021 | Yip | |
| 11,158,577 B2* | 10/2021 | Ong | H01L 21/76843 |
| 11,380,705 B2 | 7/2022 | Shamanna et al. | |
| 2011/0115010 A1* | 5/2011 | Shim | H01L 21/02365 |
| | | | 257/E27.098 |
| 2011/0147818 A1* | 6/2011 | Katsumata | H10B 43/40 |
| | | | 257/314 |
| 2016/0148946 A1* | 5/2016 | Hironaga | H10B 43/27 |
| | | | 438/586 |
| 2019/0081061 A1 | 3/2019 | Tessariol et al. | |
| 2020/0020714 A1 | 1/2020 | Oh | |
| 2020/0303398 A1* | 9/2020 | Otsu | H10B 43/27 |
| 2020/0312830 A1 | 10/2020 | Oh et al. | |
| 2020/0357813 A1 | 11/2020 | Tanzawa | |
| 2021/0050357 A1 | 2/2021 | Yip | |
| 2021/0118899 A1 | 4/2021 | King | |
| 2021/0134736 A1 | 5/2021 | Jhothiraman et al. | |
| 2021/0151455 A1 | 5/2021 | Xu et al. | |
| 2021/0193676 A1 | 6/2021 | Zhang et al. | |
| 2022/0199134 A1* | 6/2022 | Cheng | H10B 41/27 |
| 2022/0415787 A1* | 12/2022 | Kawaguchi | H01L 23/5226 |

OTHER PUBLICATIONS

International Search Report for International Application No. PCT/US2022/073627, mailed Nov. 3, 2022, 3 pages.
International Written Opinion for International Application No. PCT/US2022/073627, mailed Nov. 3, 2022, 5 pages.

* cited by examiner

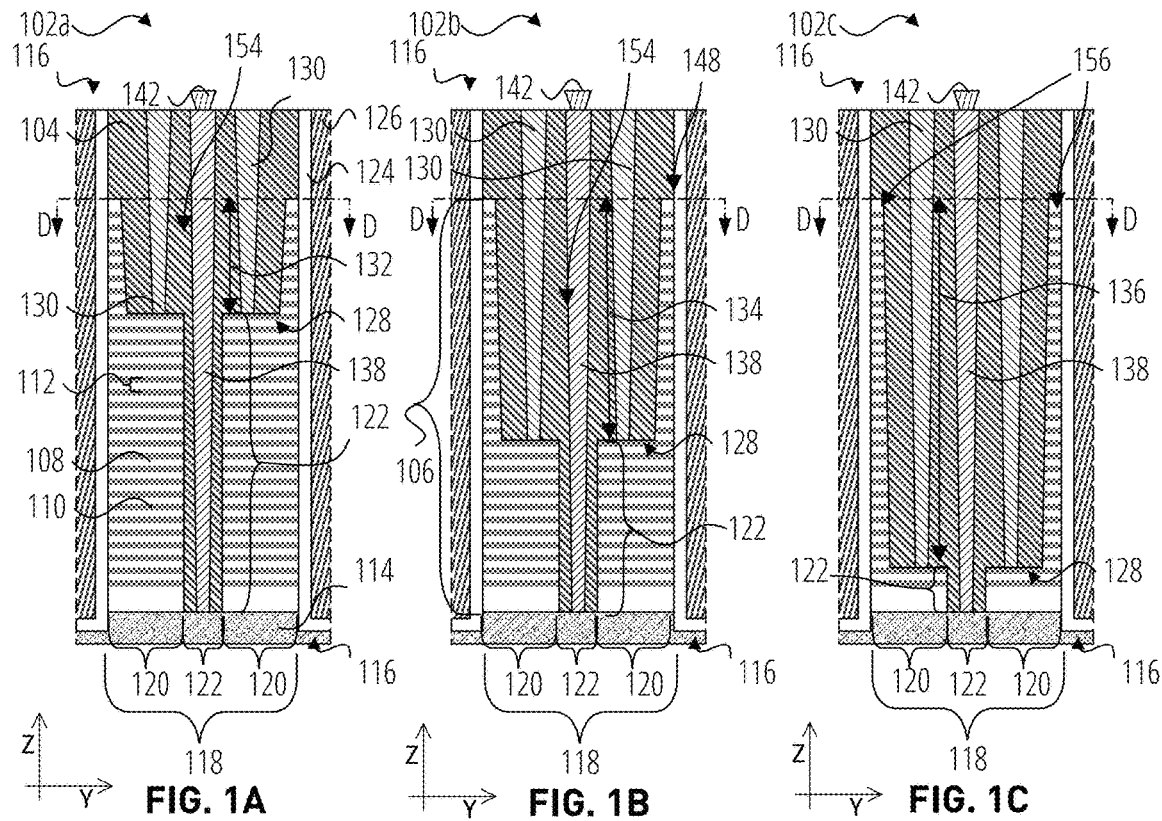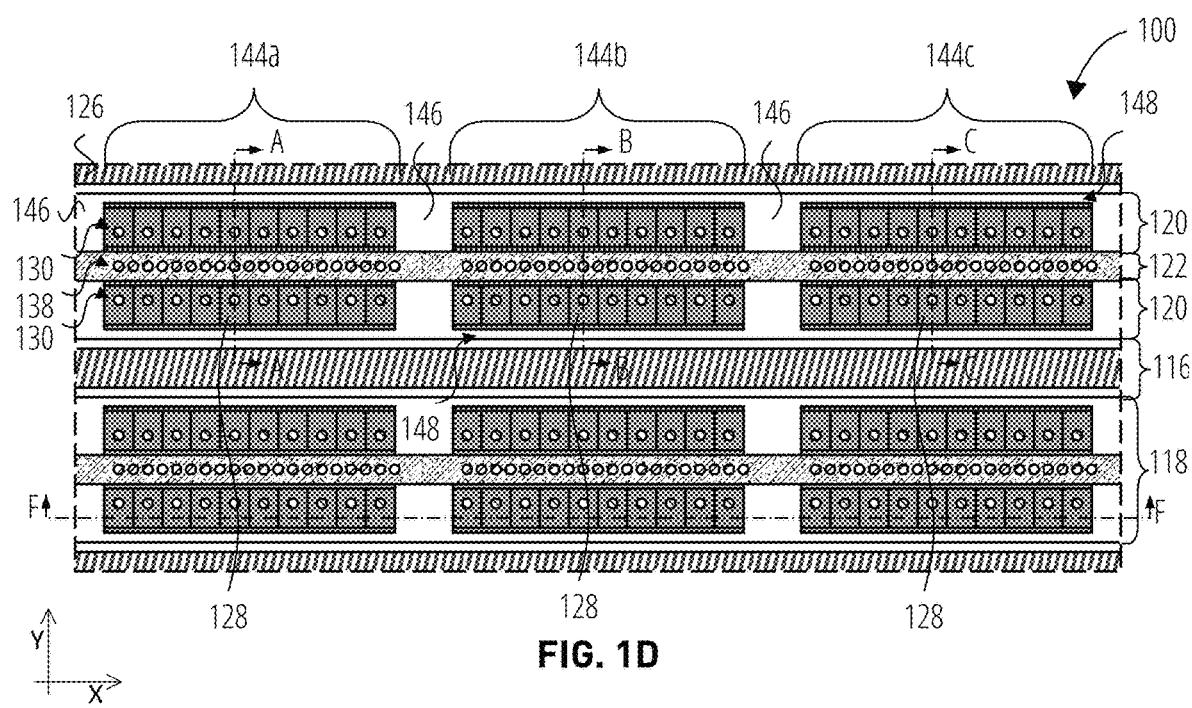

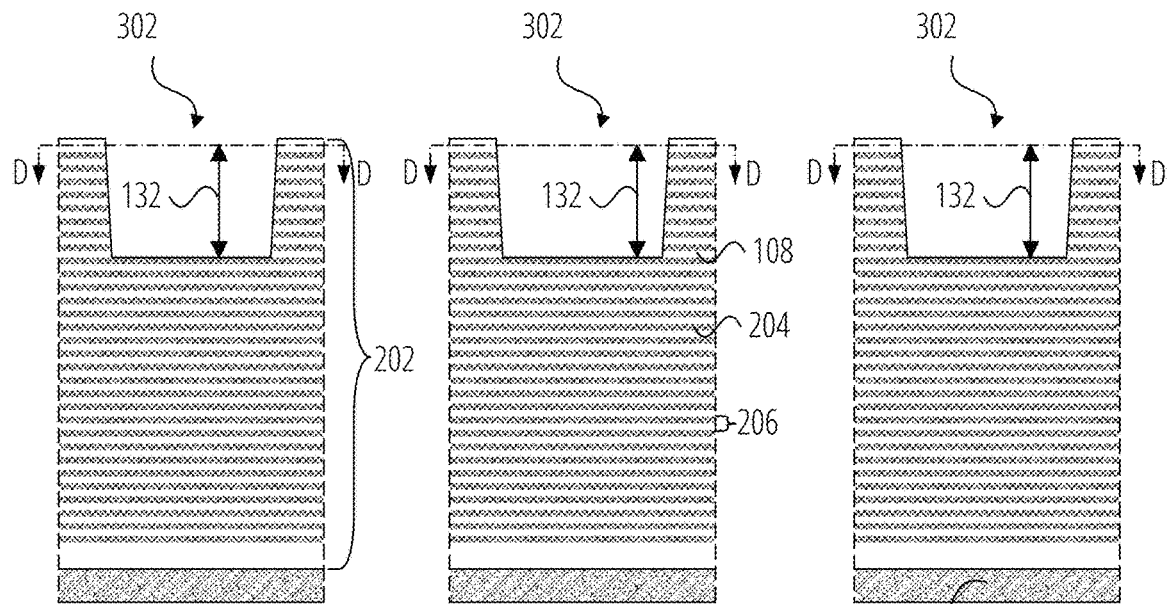
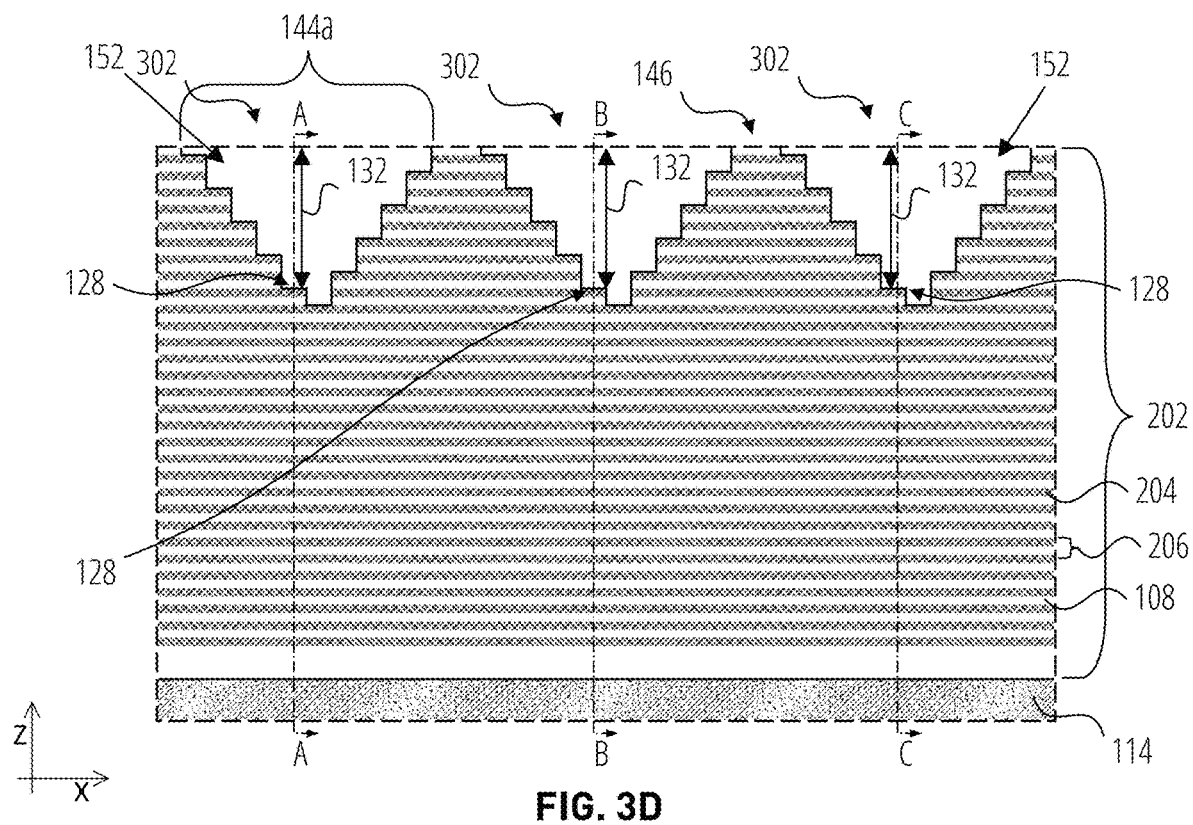

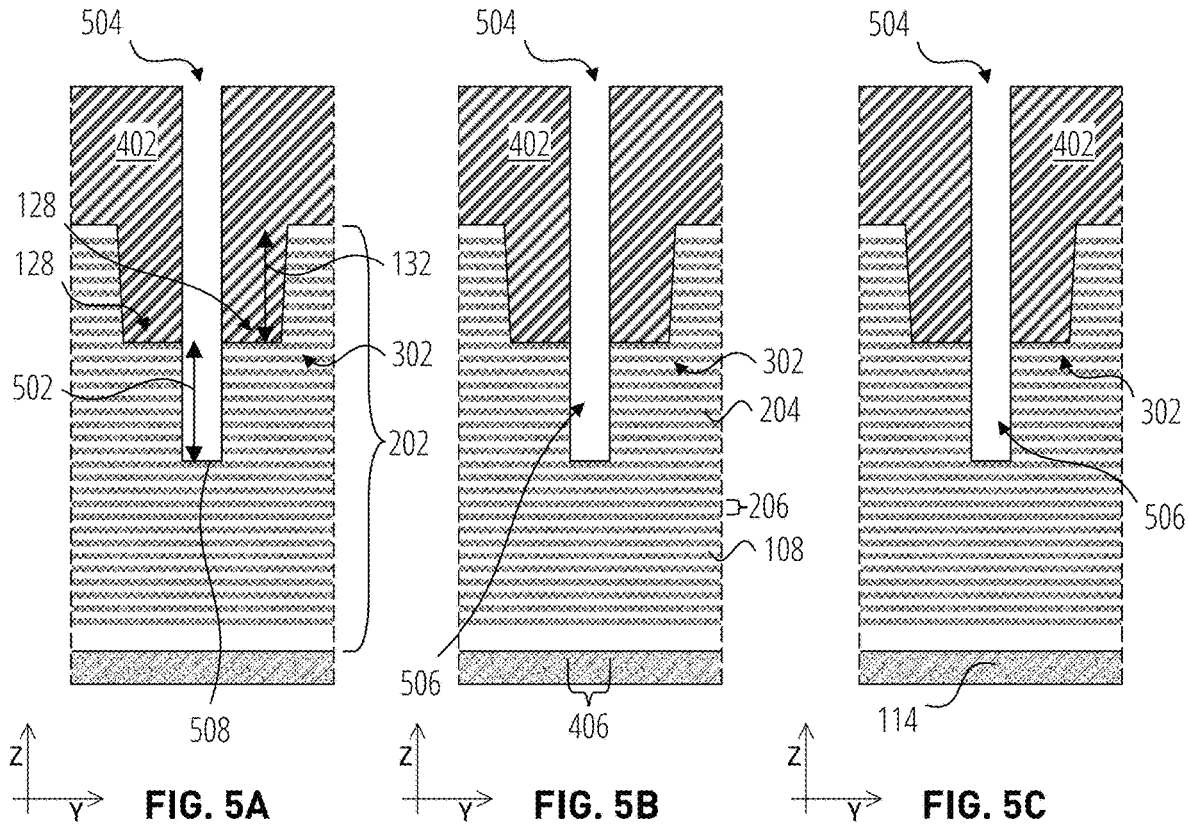
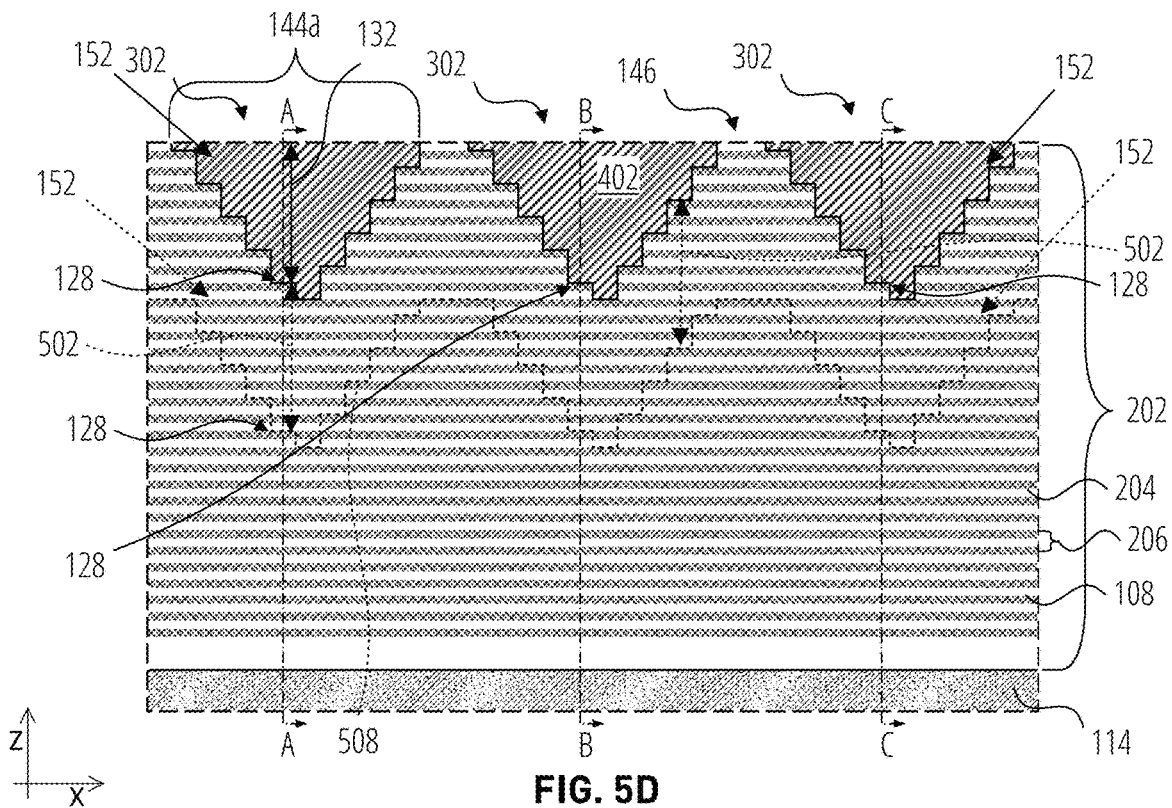

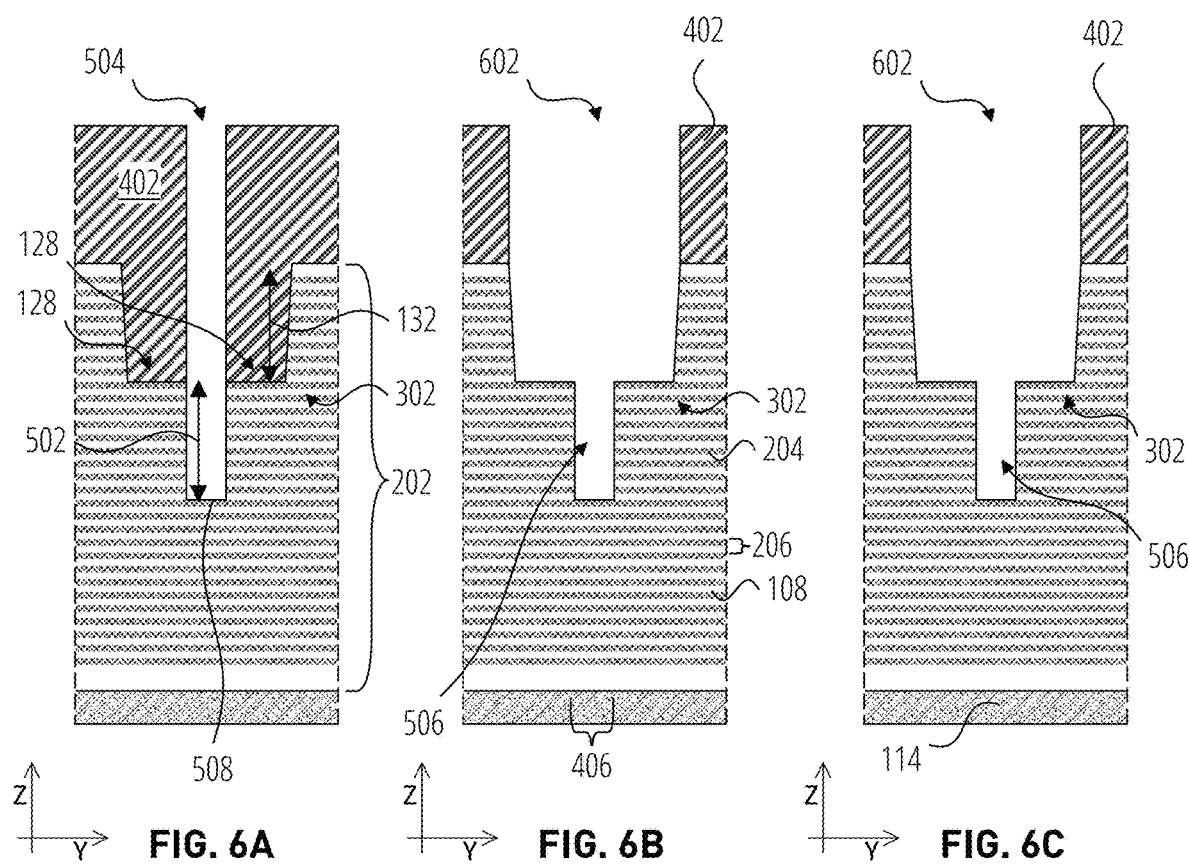

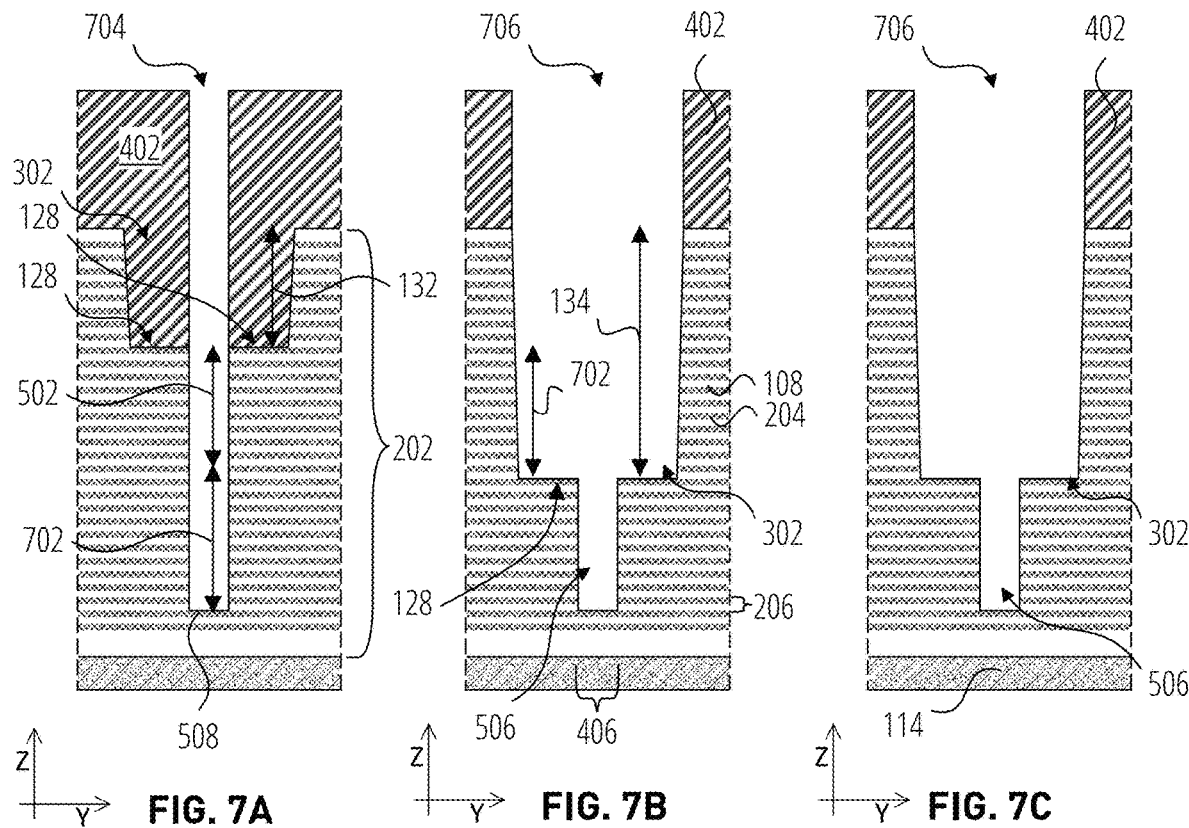
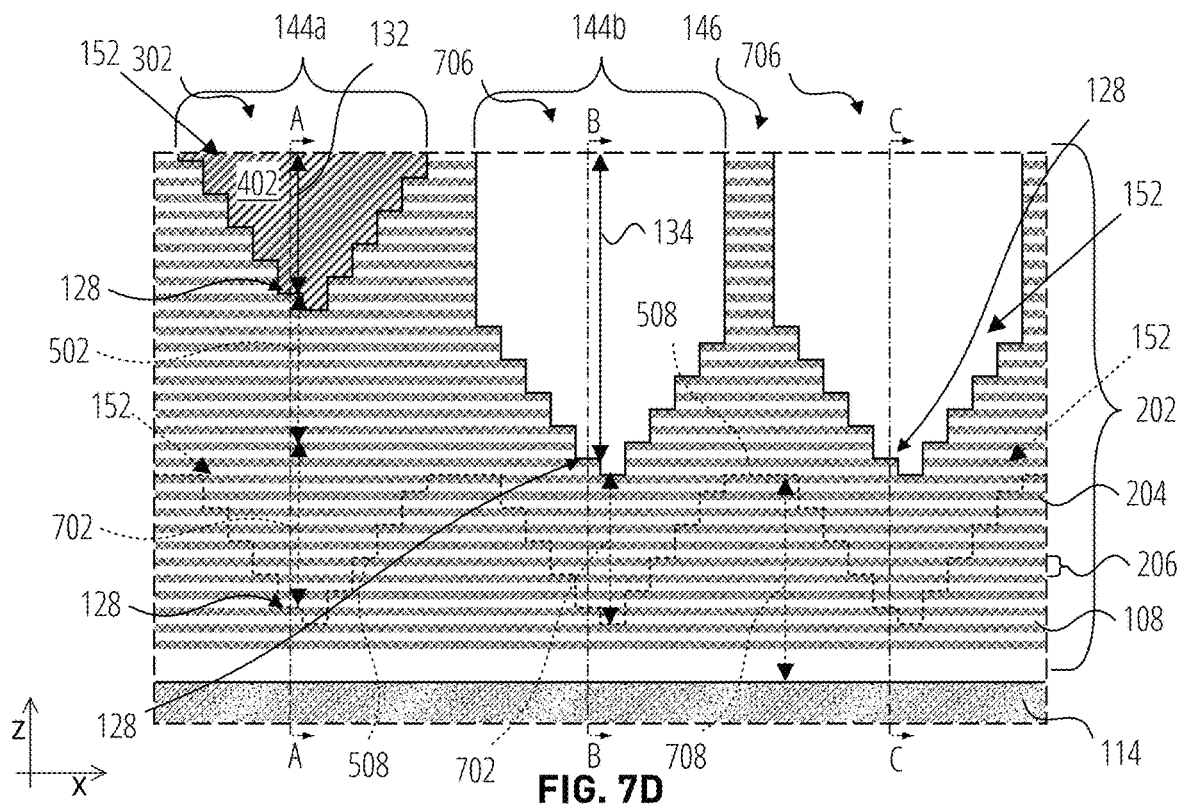
FIG. 7A  FIG. 7B  FIG. 7C  FIG. 7D

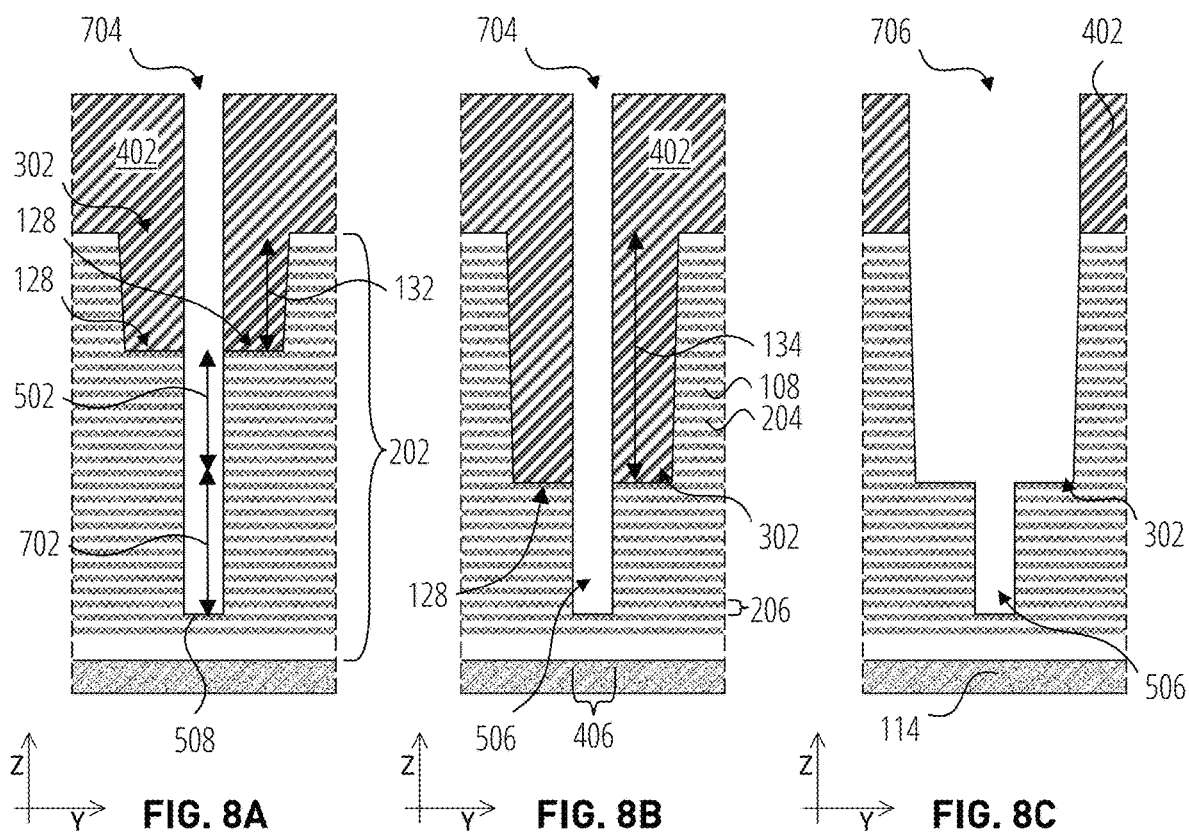

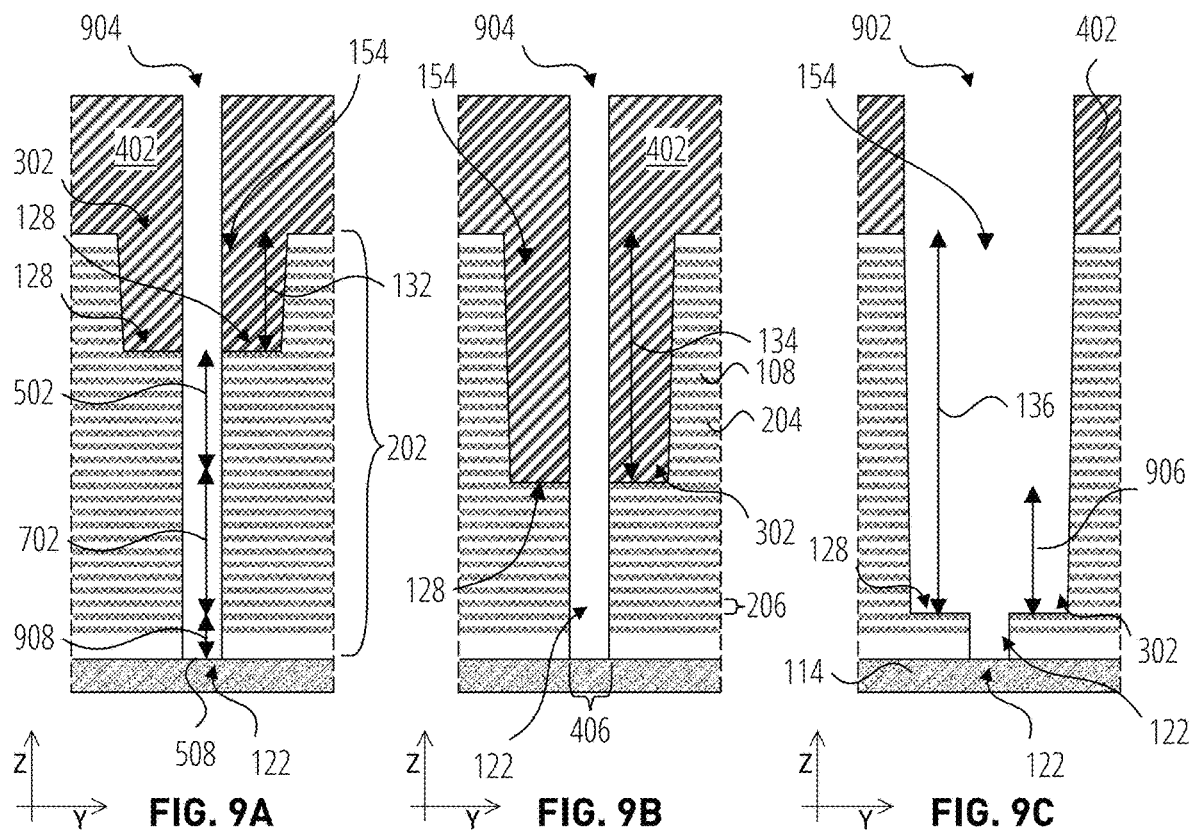
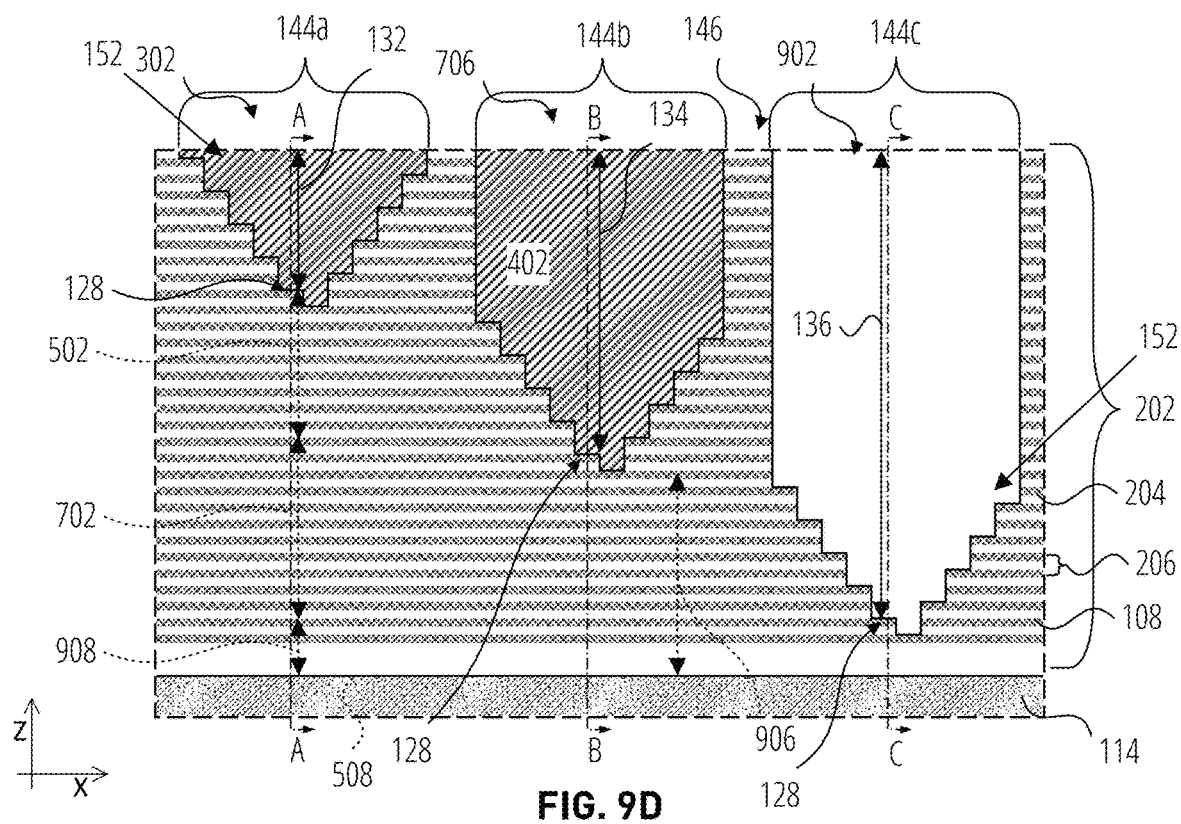

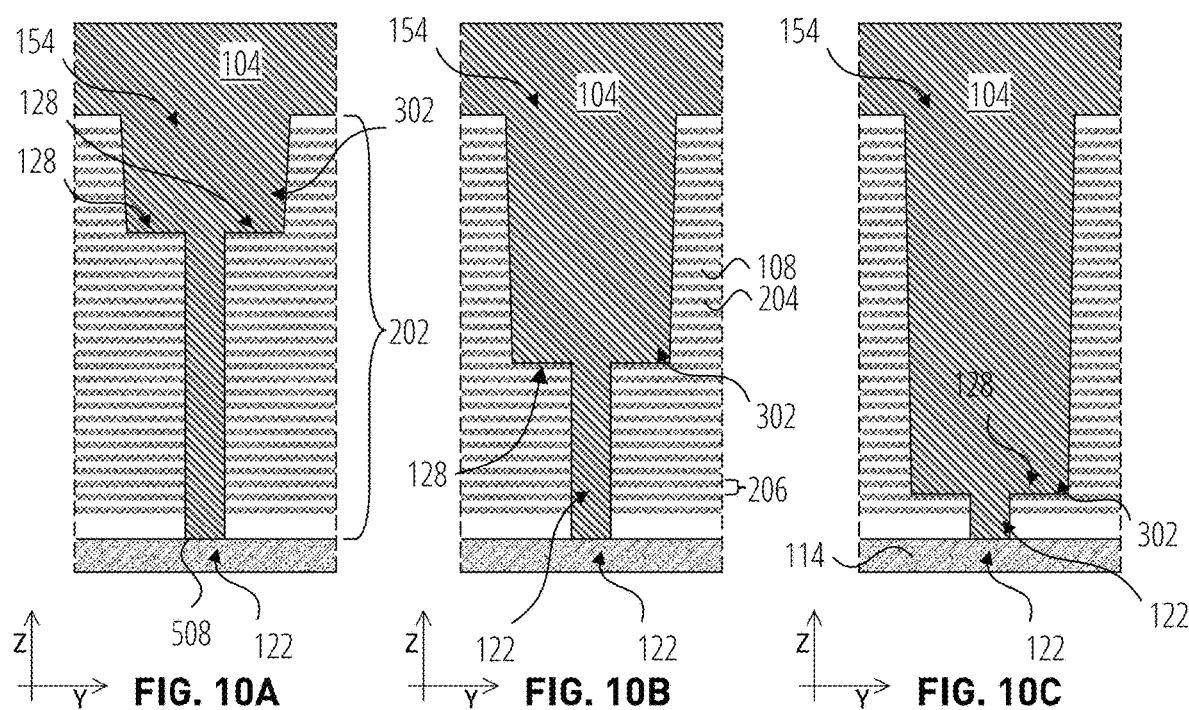

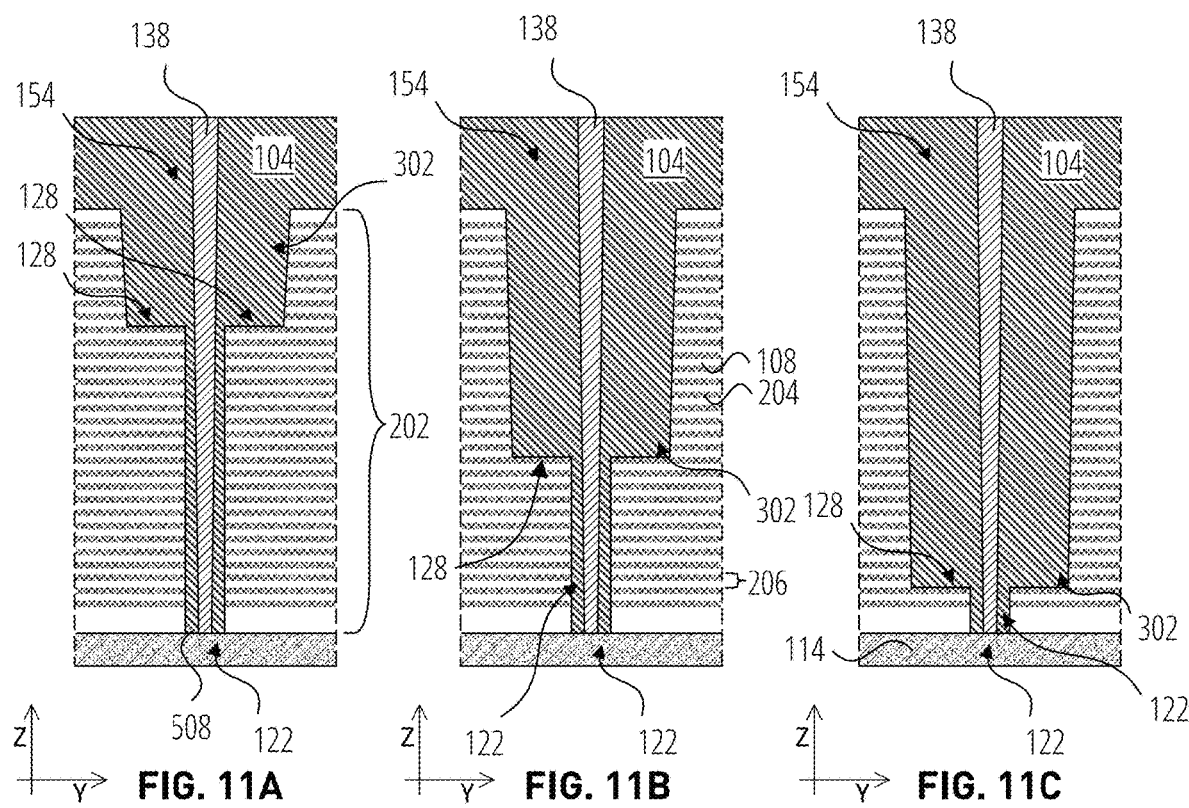

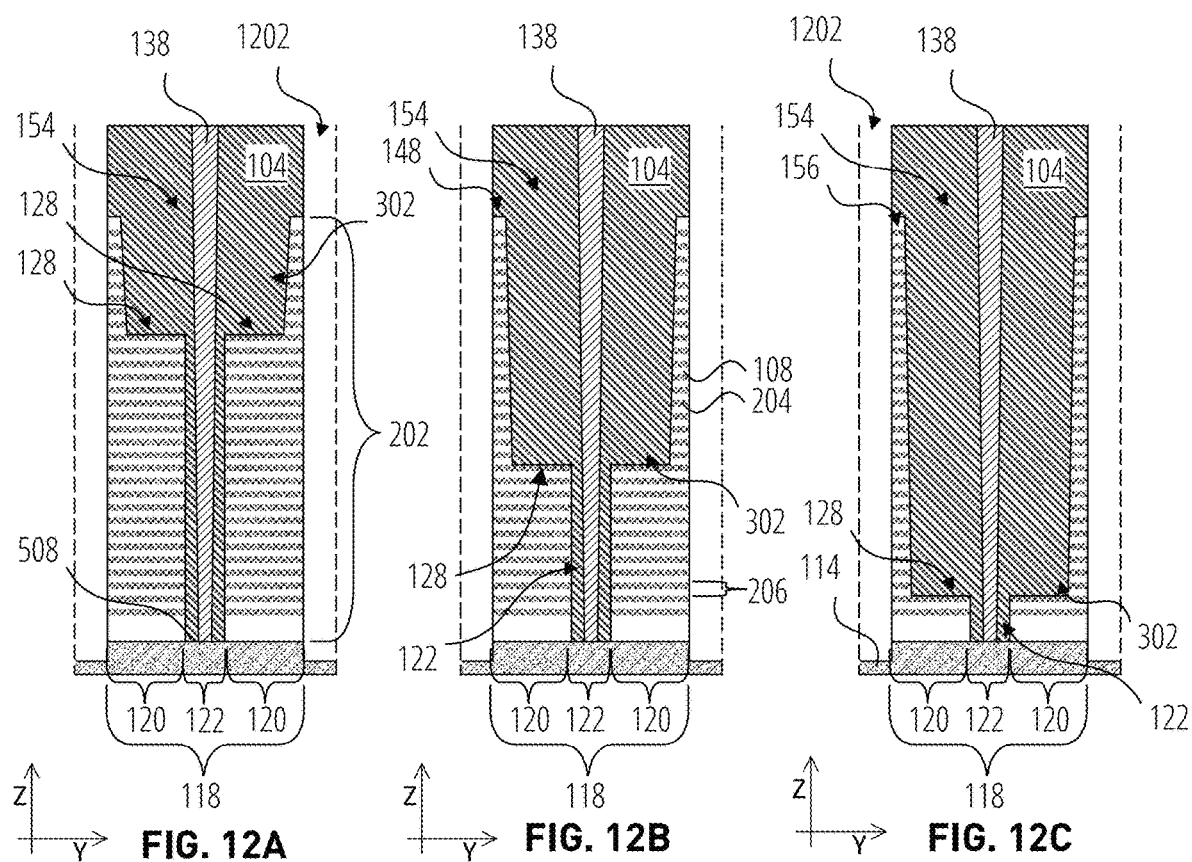

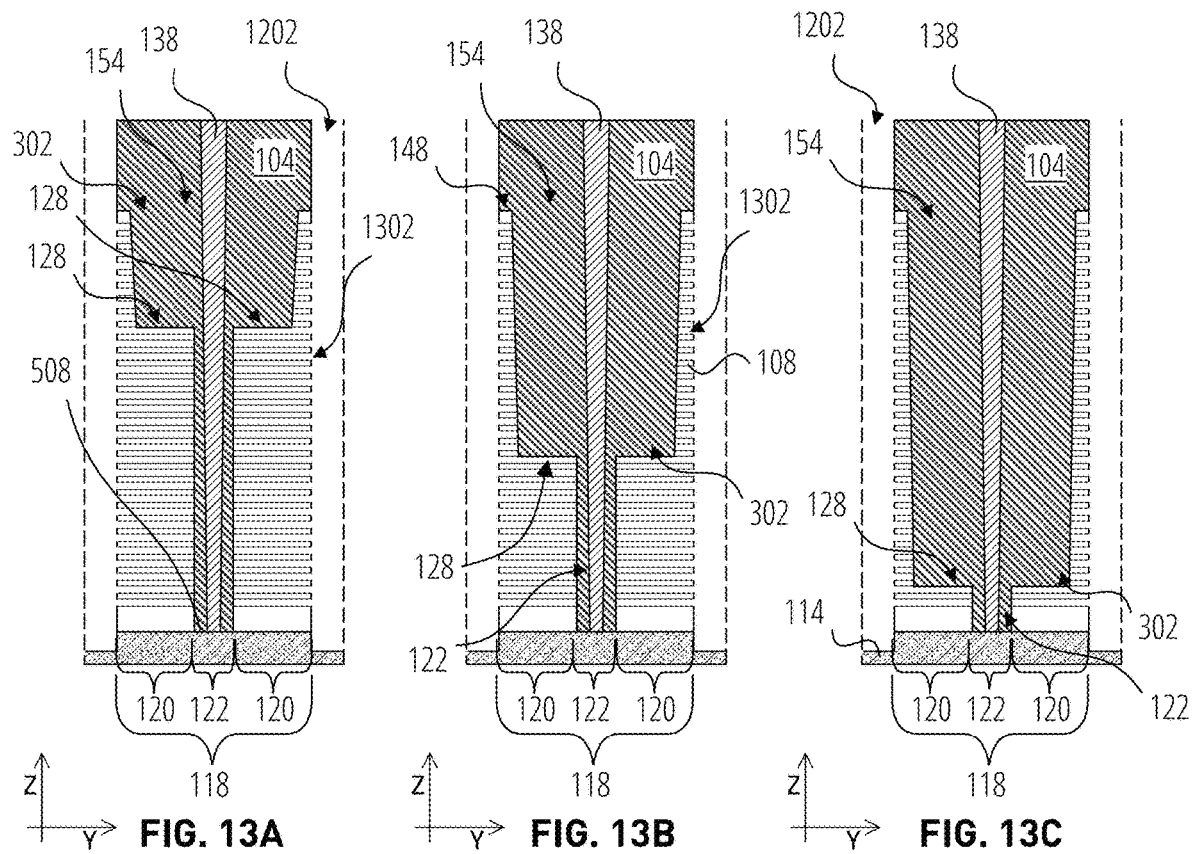

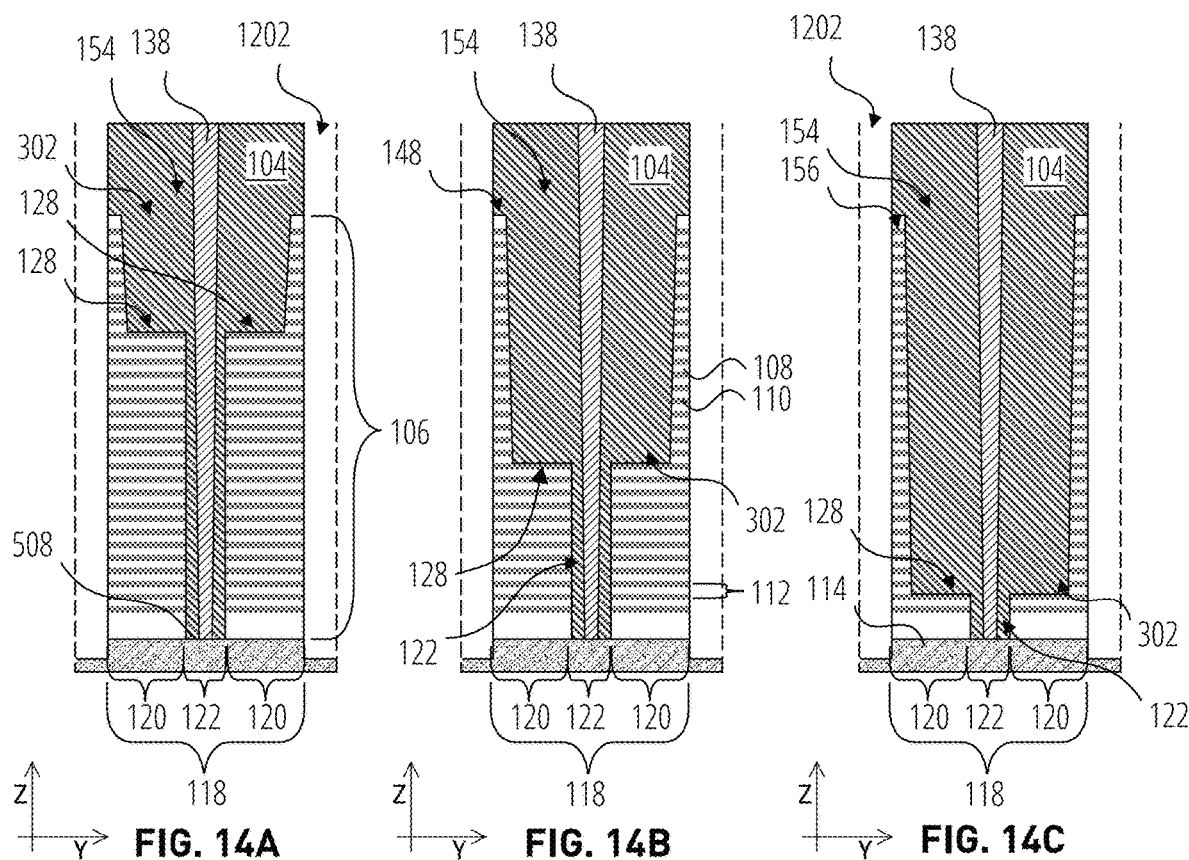

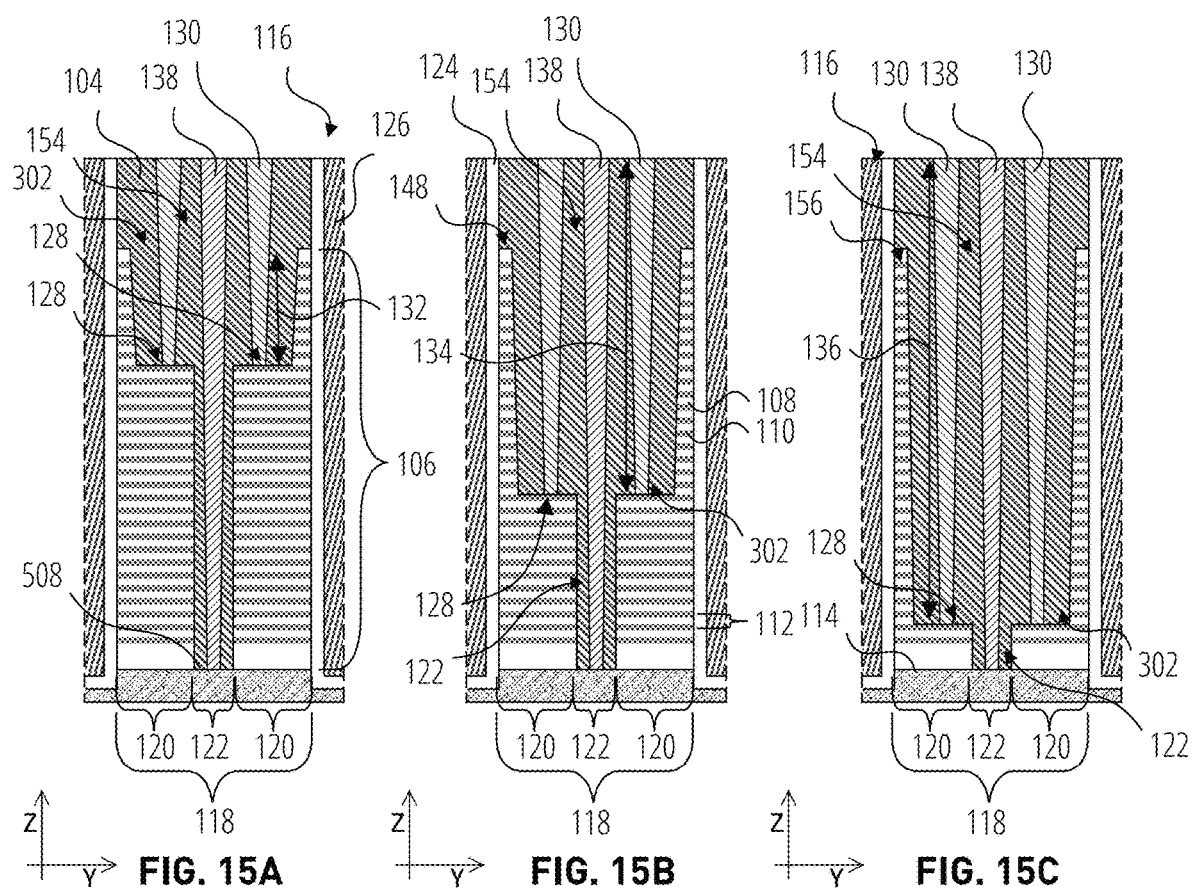

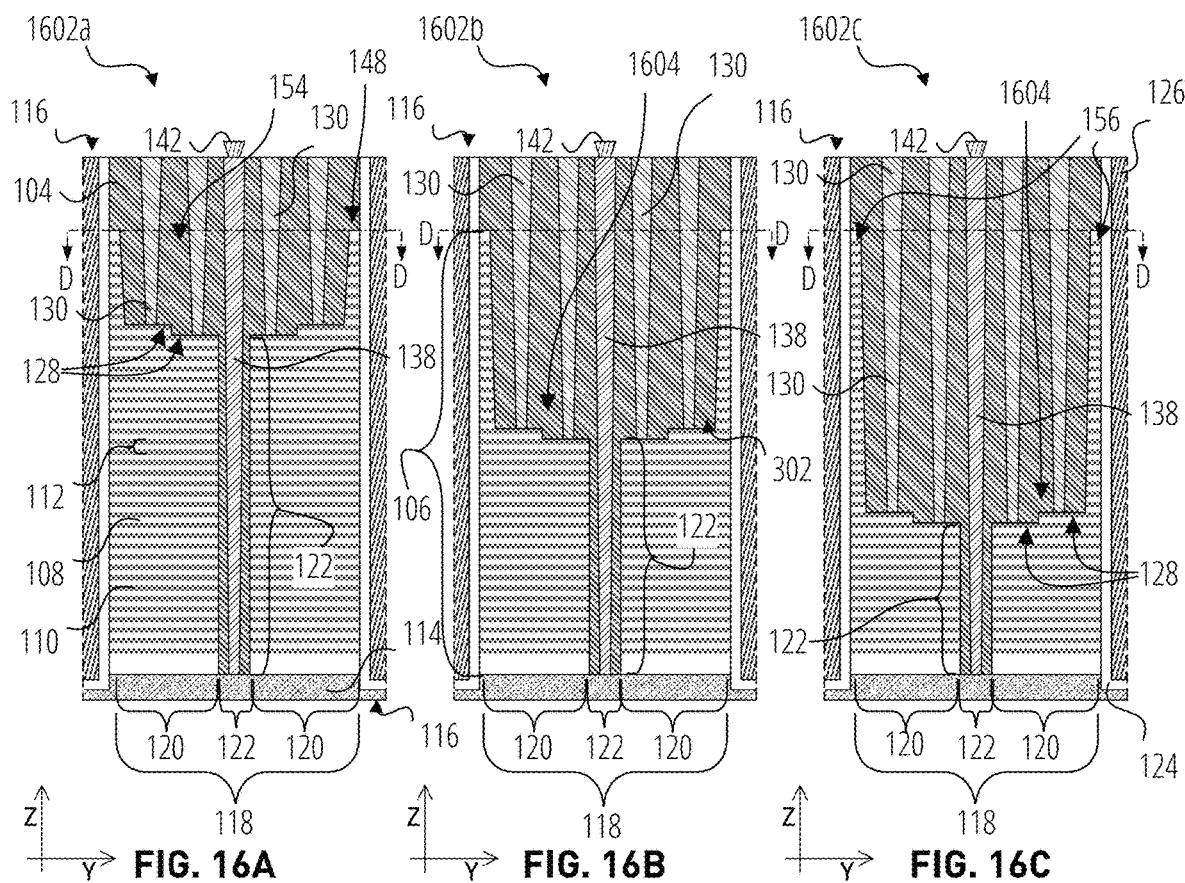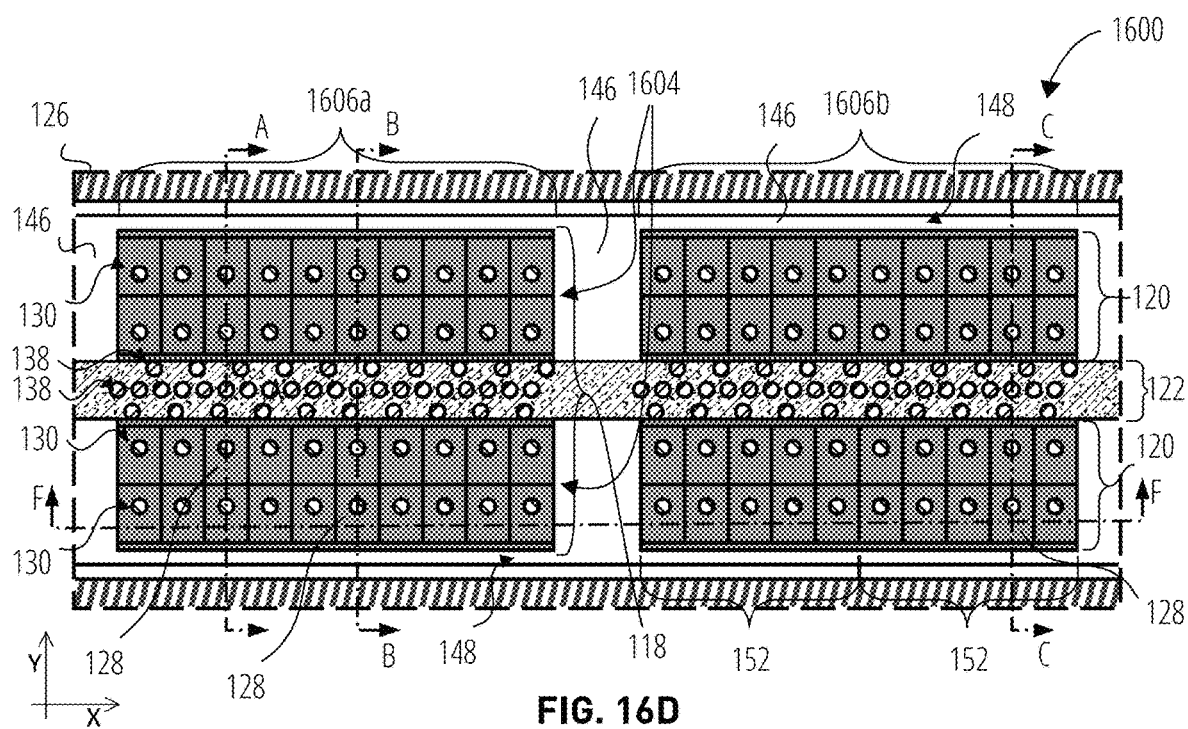

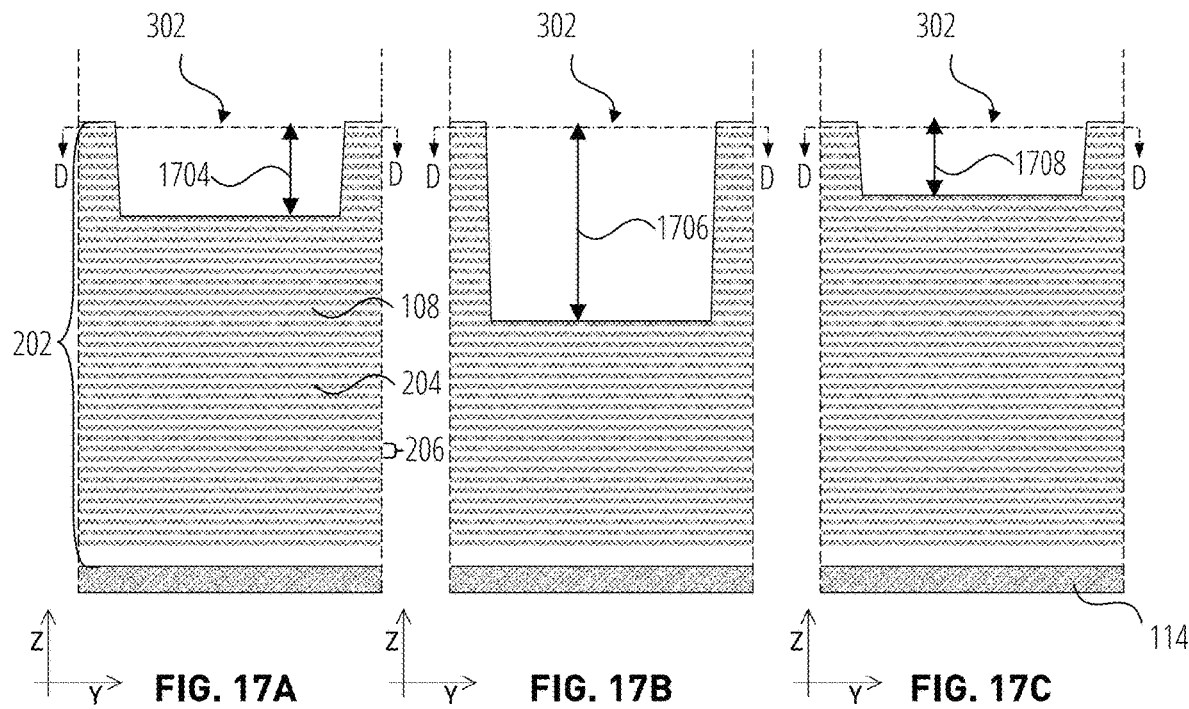
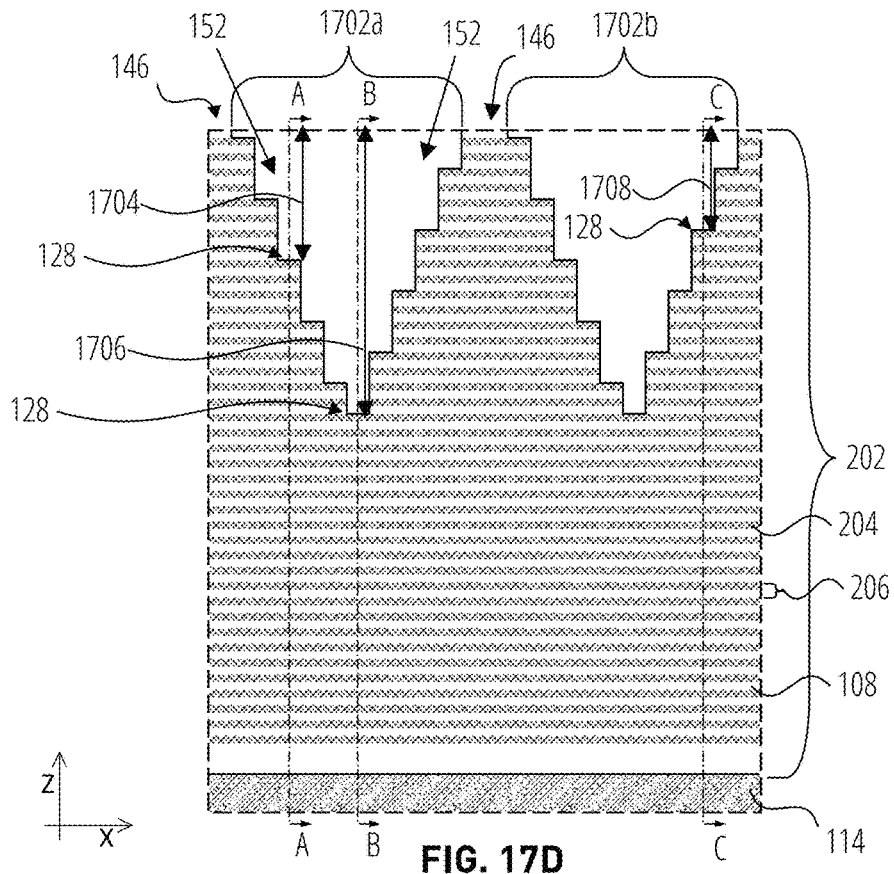

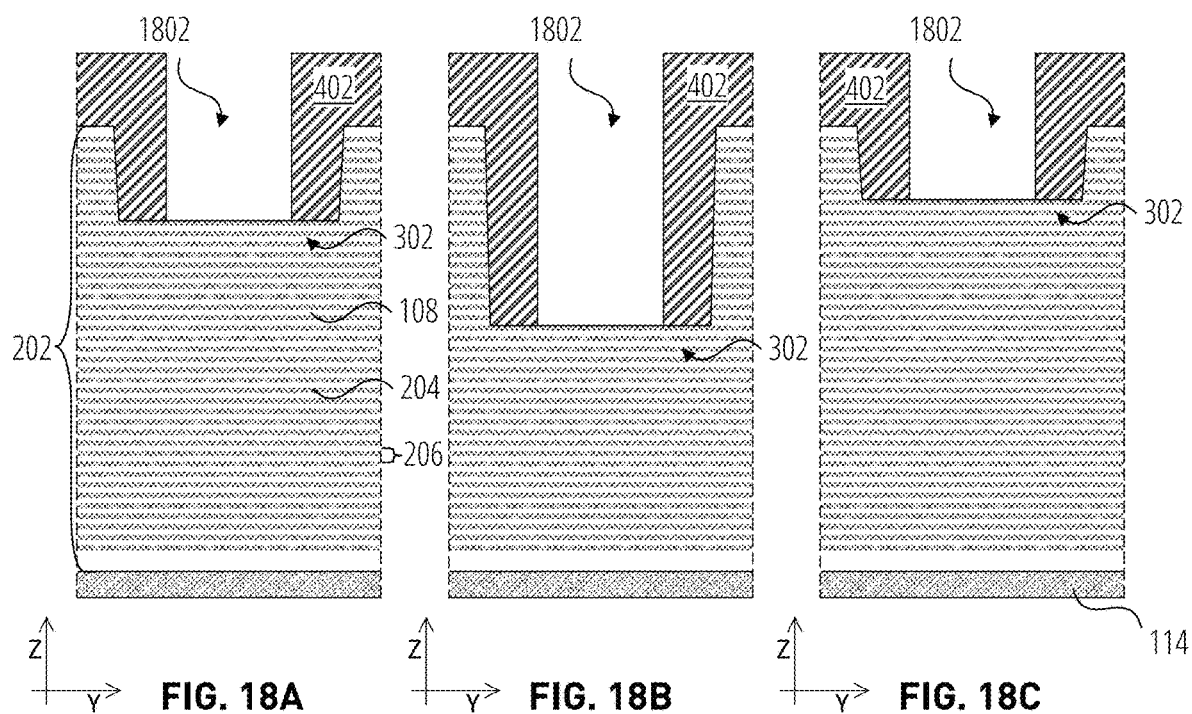

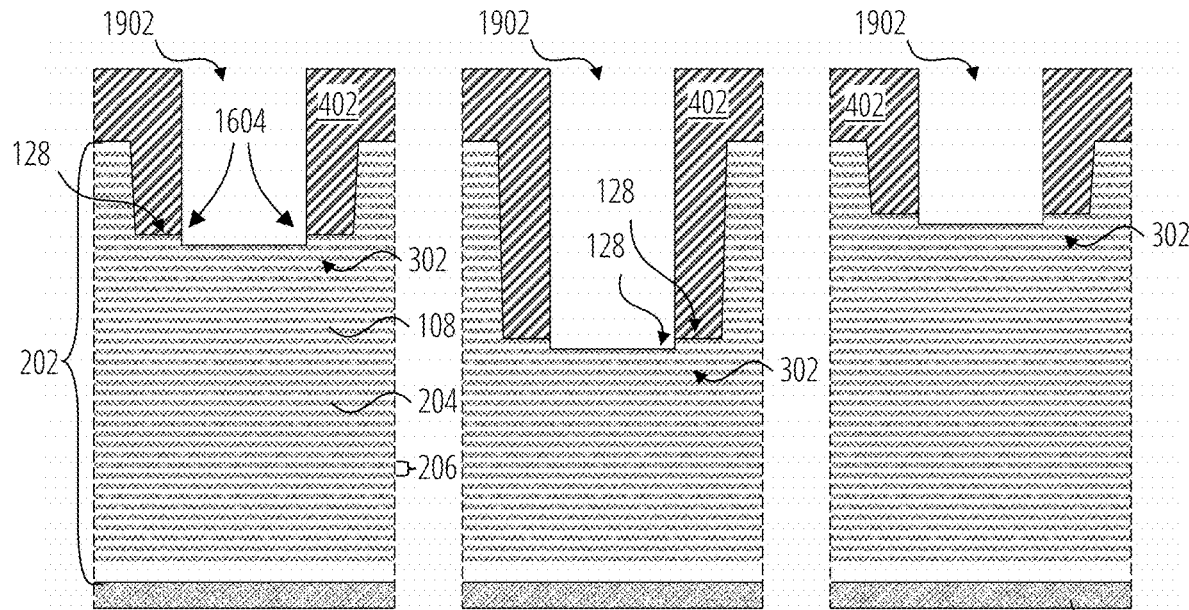
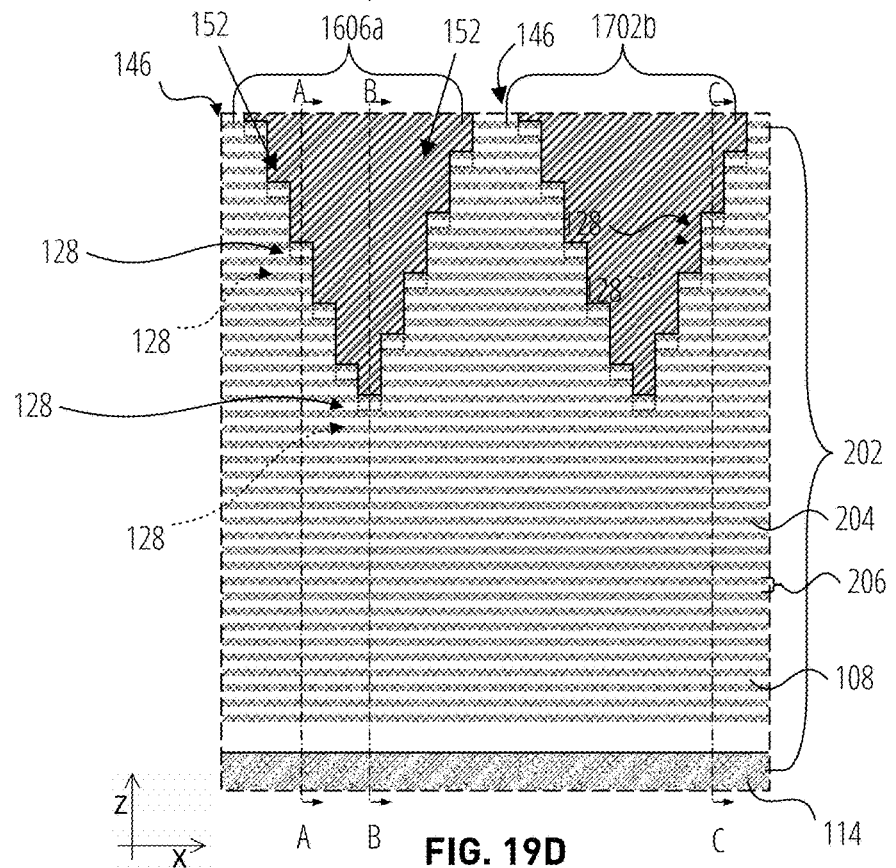

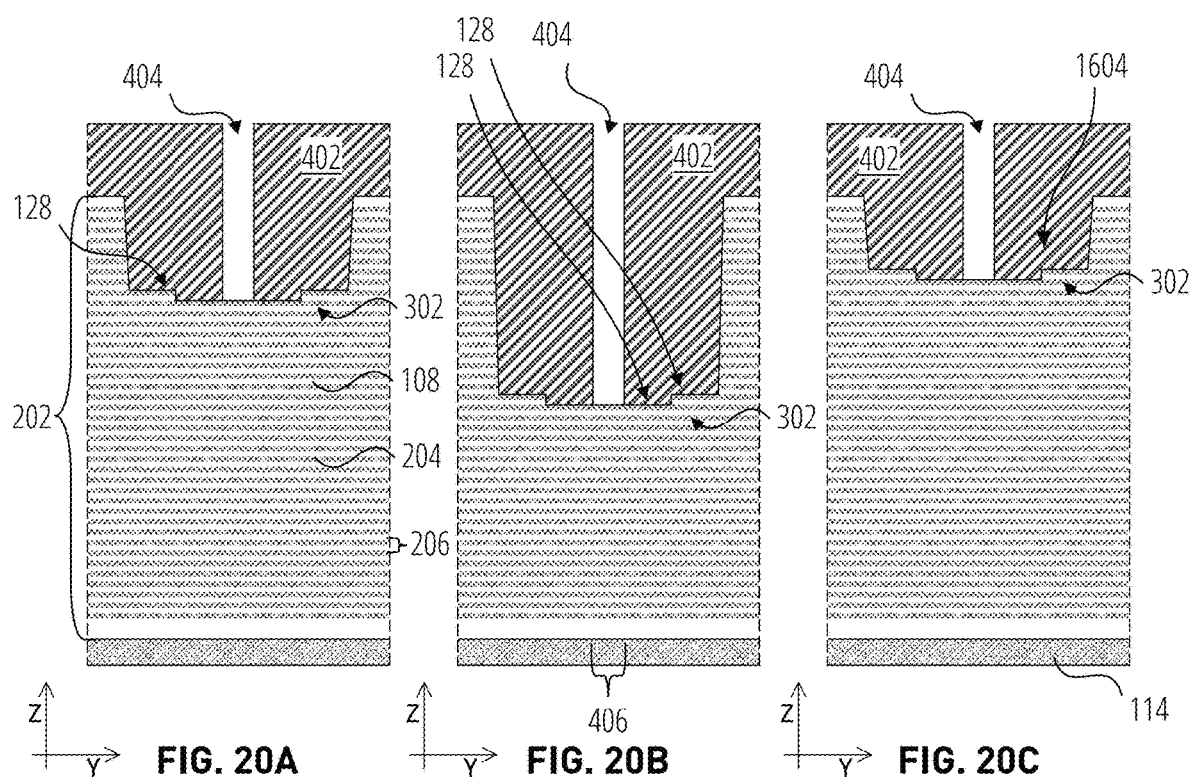

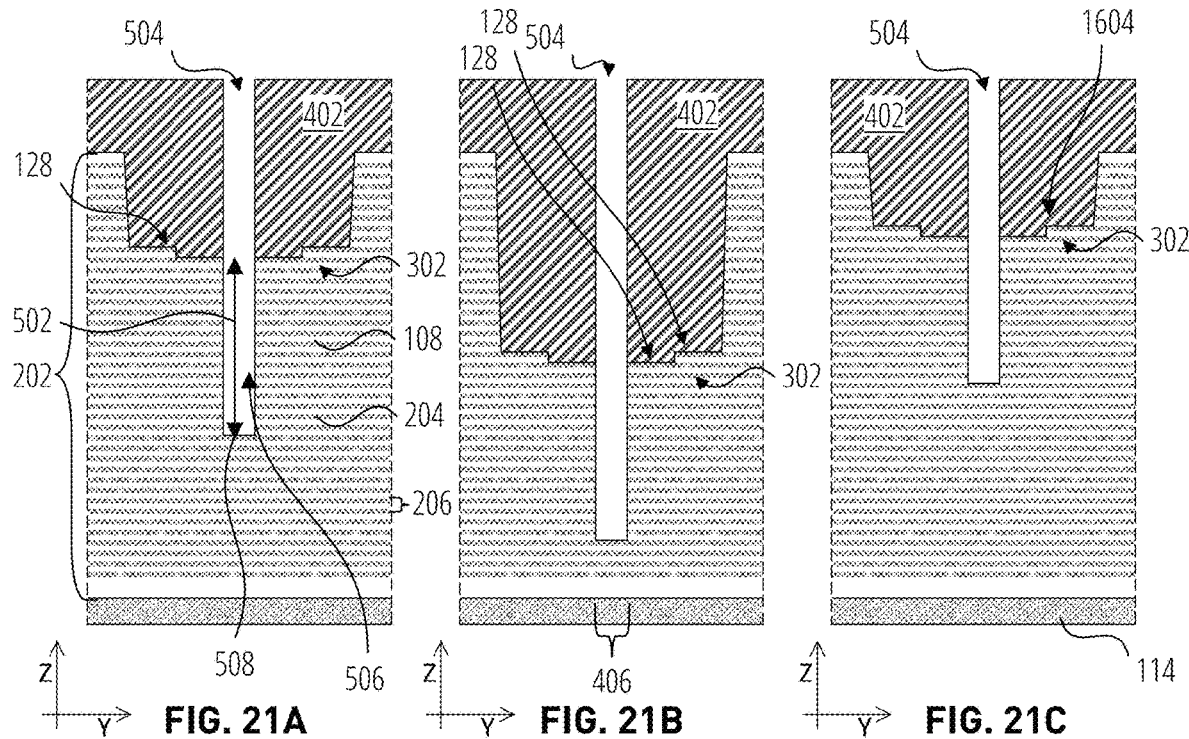
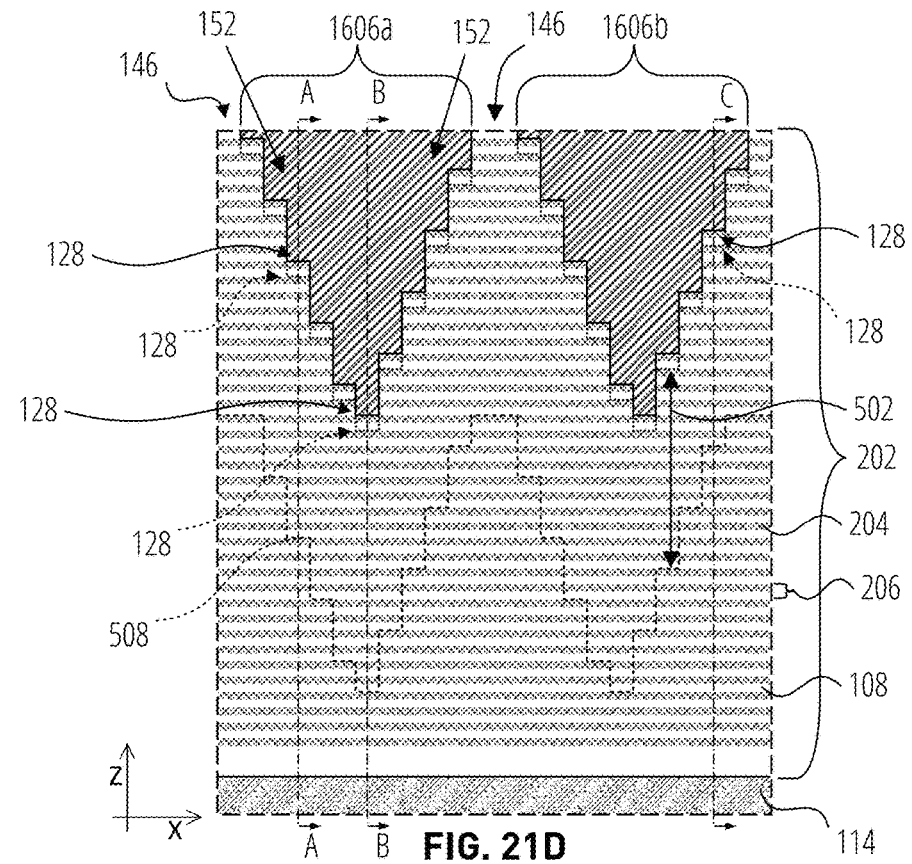

MICROELECTRONIC DEVICES WITH ACTIVE SOURCE/DRAIN CONTACTS IN TRENCH IN SYMMETRICAL DUAL-BLOCK STRUCTURE, AND RELATED SYSTEMS AND METHODS

TECHNICAL FIELD

Embodiments of the disclosure relate to the field of microelectronic device design and fabrication. More particularly, the disclosure relates to microelectronic devices (e.g., memory devices, such as 3D NAND memory devices) having a tiered stack of vertically alternating conductive structures and insulative structures, slits dividing the tiered stack into dual-block structures, and a series of stadiums defined in each block of the dual-block structure. The disclosure also relates to methods for forming such devices and to systems incorporating such devices.

BACKGROUND

Memory devices provide data storage for electronic systems. A Flash memory device is one of various memory device types and has numerous uses in modern computers and other electrical devices. A conventional Flash memory device may include a memory array that has a large number of charge storage devices (e.g., memory cells, such as non-volatile memory cells) arranged in rows and columns. In a NAND architecture type of Flash memory, memory cells arranged in a column are coupled in series, and a first memory cell of the column is coupled to a data line (e.g., a bit line). In a "three-dimensional NAND" memory device (which may also be referred to herein as a "3D NAND" memory device), a type of vertical memory device, not only are the memory cells arranged in row and column fashion in a horizontal array, but tiers of the horizontal arrays are stacked over one another (e.g., as vertical strings of memory cells) to provide a "three-dimensional array" of the memory cells. The stack of tiers vertically alternate conductive materials with insulating (e.g., dielectric) materials. The conductive materials function as control gates for, e.g., access lines (e.g., word lines) of the memory cells. Vertical structures (e.g., pillars comprising channel structures and tunneling structures) extend along the vertical string of memory cells. A drain end of a string is adjacent one of the top and bottom of the vertical structure (e.g., pillar), while a source end of the string is adjacent the other of the top and bottom of the pillar. The drain end is operably connected to a bit line, while the source end is operably connected to a source line. A 3D NAND memory device also includes electrical connections between, e.g., access lines (e.g., word lines) and other conductive structures of the device so that the memory cells of the vertical strings can be selected for writing, reading, and erasing operations.

One method of forming such electrical connections includes forming a so-called "staircase" structure having "steps" (or otherwise known as "stairs") at edges (e.g., adjacent ends) of the tiers of the stack structure. The steps define contact regions of conductive structures of the device, such as access lines (e.g., word lines), which may be formed by the conductive materials of the tiered stack. Contact structures may be formed in physical contact with the steps to provide electrical access to the conductive structures (e.g., word lines) associated with the steps. The contact structures may be in electrical communication, via conductive routing lines, to additional contact structures that communicate to a source/drain region.

Continued goals in the microelectronic device fabrication industry are to scale device features to smaller sizes while increasing device density and increasing "efficiency" (e.g., the percentage of a device's horizontal footprint that is occupied by "active" features of the device, namely, features with active involvement in writing, reading, or erasing operations). As features are scaled to increase device density, reliable and consistent fabrication of the features generally becomes more challenging, and reduced feature sizes tend to present challenges to fabrication and to maintaining sufficient performance characteristics of the device. For example, efforts to scale device features may negatively impact other aspects of device design and fabrication, such as the fabrication of relatively-small features leading to structure bending during fabrication, which may negatively impact subsequent fabrication stages and performance characteristics. Accordingly, designing and fabricating microelectronic devices, such as 3D NAND memory devices, with decreased feature sizes, increased device density, and increased efficiency and without negative impacts to fabrication (e.g., structure bending) and device performance continues to present challenges.

BRIEF DESCRIPTION OF THE DRAWINGS

FIG. 1A, FIG. 1B, and FIG. 1C are schematic illustrations in cross-sectional, elevational, and longitudinal view of structures at various positions along the width of a microelectronic device structure, which microelectronic device structure is schematically illustrated in top plan view in FIG. 1D and FIG. 1E and in cross-sectional, elevational, and lateral view in FIG. 1F, according to embodiments of the disclosure. FIG. 1A, FIG. 1B, and FIG. 1C, respectively, are views taken along section lines A-A, B-B, and C-C, respectively, of FIG. 1D and FIG. 1F. FIG. 1D and FIG. 1E are views corresponding to section lines D-D of FIG. 1A to FIG. 1C. FIG. 1E illustrates additional features not illustrated in FIG. 1D for ease of illustration therein and further includes additional features above the elevation of section line D-D.

FIG. 2A to FIG. 15C are schematic illustrations in cross-sectional, elevational, and either longitudinal (as indicated by Y- and Z-axes) or lateral (as indicated by X- and Z-axes) views of various stages of processing to fabricate the microelectronic device structures of FIG. 1A to FIG. 1F, wherein figures sharing the same number (regardless of letter accompaniment) are illustrations sharing a same stage of fabrication but at different points of view; figures sharing the same letter (regardless of number accompaniment) are illustrations sharing a same point of view but at different stages in the fabrication; figures with an "A," "B," or "C" letter accompaniment are views corresponding to FIG. 1A, FIG. 1B, and FIG. 1C, respectively, and to section lines A-A, B-B, and C-C, respectively, of FIG. 1D and FIG. 1F; and figures with a "D" letter accompaniment are views corresponding to FIG. 1F and to section line F-F of FIG. 1D.

FIG. 16A, FIG. 16B, and FIG. 16C are schematic illustrations in cross-sectional, elevational, and longitudinal view of structures at various positions along the width of a microelectronic device structure, which microelectronic device structure is schematically illustrated in top plan view in FIG. 16D and FIG. 16E and in cross-sectional, elevational, and lateral view in FIG. 16F, according to embodiments of the disclosure. FIG. 16A, FIG. 16B, and FIG. 16C, respectively, are views taken along section lines A-A, B-B, and C-C, respectively, of FIG. 16D and FIG. 16F. FIG. 16D and FIG. 16E are views corresponding to section lines D-D of FIG. 16A to FIG. 16C. FIG. 16E illustrates additional features not illustrated in FIG. 16D for ease of illustration therein and further includes additional features above the elevation of section line D-D.

FIG. 17A to FIG. 21D are schematic illustrations in cross-sectional, elevational, and either longitudinal (as indicated by Y- and Z-axes) or lateral (as indicated by X- and Z-axes) views of various stages of processing to fabricate the microelectronic device structures of FIG. 16A to FIG. 16F, wherein figures sharing the same number (regardless of letter accompaniment) are illustrations sharing a same stage of formation but at different points of view; figures sharing the same letter (regardless of number accompaniment) are illustrations sharing a same point of view but at different stages in the fabrication; figures with an "A," "B," or "C" letter accompaniment are views corresponding to FIG. 16A, FIG. 16B, and FIG. 16C, respectively, and to section lines A-A, B-B, and C-C, respectively, of FIG. 16D and FIG. 16F; and figures with a "D" letter accompaniment are views corresponding to FIG. 16F and to section line F-F of FIG. 16D.

DETAILED DESCRIPTION

Figure 1E:
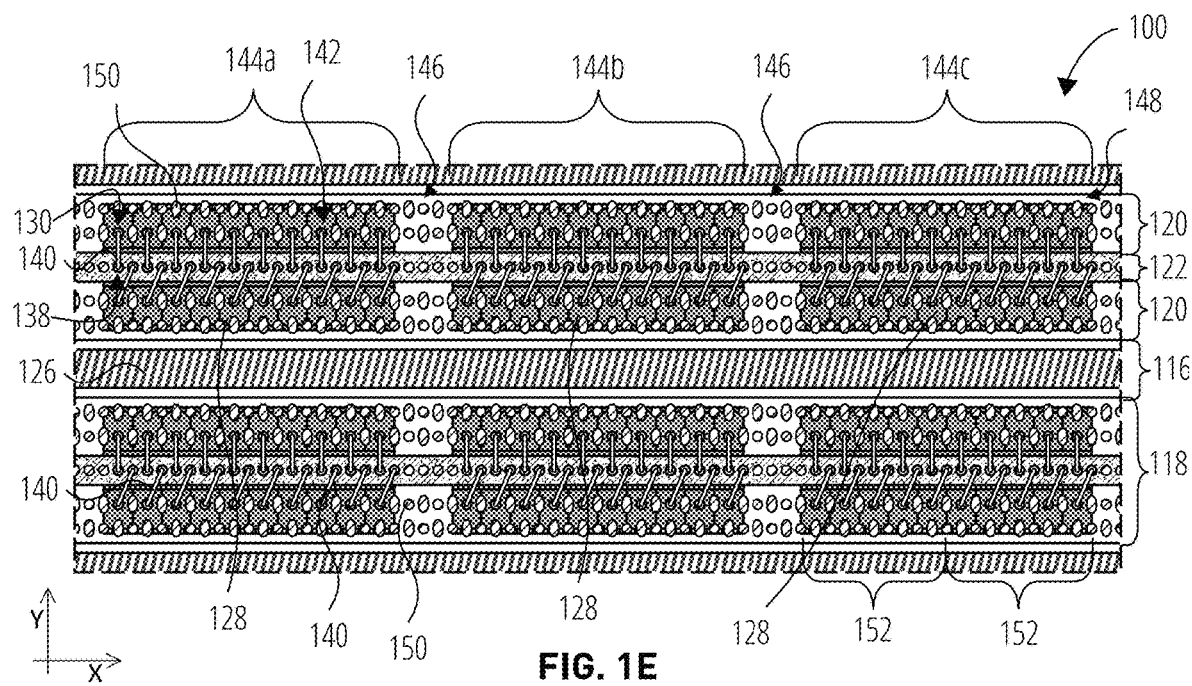

Structures (e.g., microelectronic device structures), apparatuses (e.g., microelectronic devices), and systems (e.g., electronic systems), according to embodiments of the disclosure, include a stack of vertically alternating conductive structures and insulative structures arranged in tiers and with slit structures dividing the stack into a series of dual-block structures. A series of opposing stadiums is formed in the dual-block structures. The stadiums include staircase structures having steps defined by ends (e.g., surfaces adjacent sidewalls) of at least some of the conductive structures of the tiers of the stack. The dual-block structures are substantially symmetrically structured about a trench that extends along a width of the series of stadiums, between opposing stadiums of the dual-block structures. "Active" source/drain contacts are positioned within the trench. The trench and the adjacent stadiums together form substantially a "T" shape, with the "stem" of the "T" provided by the trench between the opposing stadiums and with the "crossbars" (or "shoulders") of the "T" provided by the steps of the staircases in the opposing stadiums. The substantial symmetrical design of the dual-block structures may be maintained during significant stages of fabrication to lessen or avoid material stress and/or strain imbalances that may otherwise cause block bending. By avoiding block bending, the features of the microelectronic device structure may be more reliably and consistently fabricated. Moreover, by locating the active source/drain contacts within the trench between opposing stadiums of a dual-block structure-rather than, e.g., within more distal areas like so-called "crests"—the distal areas may be formed to occupy a relatively smaller footprint, more active source/drain contacts may be included within a given block, and/or conductive routing lines communicating with the active source/drain contacts may be less crowded and less complex. In some embodiments, a "step drop" may be included on each side of the trench to effectively multiply (e.g., double) the number of opposing staircases and the number of step contacts included in a given stadium, which may enable additional device scaling by facilitating fewer stadiums in a dual-block structure without lessening the number of steps (e.g., the number of contactable conductive structures of the tiered stack).

As used herein, the term "active," when used in reference to a contact or other conductive structure, means and includes a contact or other conductive structure configured to be functionally involved in at least one electrical or storage operation of features of the microelectronic device, such as electrical communication to other conductive component(s) and/or writing, reading, and/or erasing operations of the device. In contrast, a "non-active," "support," or "dummy" structure means and refers to a structure not functionally involved in at least one electrical or storage operation of features of the microelectronic device.

As used herein, a feature referred to with the adjective "source/drain" means and refers to the feature being configured for association with either or both the source region and the drain region of the device that includes the "source/drain" feature. A "source region" may be otherwise configured as a "drain region" and vice versa without departing from the scope of the disclosure.

As used herein, the term "opposing"—when referring to two features—means and includes the features facing one another from opposite directions. For example, "opposing staircases" may include a descending staircase and an ascending staircase with steps extending laterally toward one another and with the descending staircase descending toward a base of the ascending staircase. As another example, "opposing stadiums" may include stadiums with steps extending longitudinally toward one another from respective bridges.

As used herein, the terms "opening," "trench," "slit," "recess," and "void" mean and include a volume extending through or into at least one structure or at least one material, leaving a gap in that at least one structure or at least one material, or a volume extending between structures or materials, leaving a gap between the structures or materials. Unless otherwise described, an "opening," "trench," "slit," and/or "recess" is not necessarily empty of material. That is, an "opening," "trench," "slit," or "recess" is not necessarily void space. An "opening," "trench," "slit," or "recess" formed in or between structures or materials may comprise structure(s) or material(s) other than that in or between which the opening is formed. And, structure(s) or material(s) "exposed" within an opening, trench, slit, or recess is/are not necessarily in contact with an atmosphere or non-solid environment. Structure(s) or material(s) "exposed" within an opening, trench, slit, or recess may be adjacent or in contact with other structure(s) or material(s) that is/are disposed within the opening, trench, slit, or recess. In contrast, unless otherwise described, a "void" may be substantially or wholly empty of material. A "void" formed in or between structures or materials may not comprise structure(s) or material(s) other than that in or between which the "void" is formed. And, structure(s) or material(s) "exposed" within a "void" may be in contact with an atmosphere or non-solid environment.

As used herein, the terms "trench" and "slit" mean and include an elongate opening, while the terms "opening," "recess," and "void" may include one or more of an elongate opening, an elongate recess, an elongate void, a non-elongate opening, a non-elongate recess, or a non-elongate void.

As used herein, the term "elongate" means and includes a geometric shape including a dimension (e.g., a width, as defined below) in a first horizontal direction (e.g., a lateral direction, as defined below) that is greater than an additional dimension (e.g., a length, as defined below) in a second horizontal direction (e.g., a longitudinal direction, as defined below) orthogonal to the first horizontal direction, or vice versa.

As used herein, the terms "substrate" and "base structure" mean and include a base material or other construction upon which components, such as those within memory cells, are formed. The substrate or base structure may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" or "base structure" in the following description, previous process stages may have been utilized to form materials, structures, or junctions in the base semiconductor structure, base structure, or other foundation.

As used herein, the terms "insulative" and "insulating," when used in reference to a material or structure, means and includes a material or structure that is electrically insulative or electrically insulating. An "insulative" or "insulating" material or structure may be formed of and include one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric carboxynitride material (e.g., a silicon carboxynitride ($SiO_xC_zN_y$)), and/or air. Formulae including one or more of "x," "y," and/or "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and/or "z" atoms of an additional element (if any), respectively, for every one atom of another element (e.g., Si, Al, Hf, Nb, Ti). As the formulae are representative of relative atomic ratios and not strict chemical structure, an insulative material or insulative structure may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "sacrificial," when used in reference to a material or structure, means and includes a material or structure that is formed during a fabrication process but which is removed (e.g., substantially removed) prior to completion of the fabrication process.

As used herein, the term "horizontal" means and includes a direction that is parallel to a primary surface of the substrate on which the referenced material or structure is located. The "width" and "length" of a respective material or structure may be defined as dimensions in a horizontal plane. With reference to the figures, the "horizontal" direction may be perpendicular to an indicated "Z" axis, may be parallel to an indicated "X" axis, and may be parallel to an indicated "Y" axis.

As used herein, the term "lateral" means and includes a direction in a horizontal plane parallel to a primary surface of the substrate on which a referenced material or structure is located and substantially perpendicular to a "longitudinal" direction. The "width" of a respective material or structure may be defined as a dimension in the lateral direction of the horizontal plane. With reference to the figures, the "lateral" direction may be parallel to an indicated "X" axis, may be perpendicular to an indicated "Y" axis, and may be perpendicular to an indicated "Z" axis.

As used herein, the term "longitudinal" means and includes a direction in a horizontal plane parallel to a primary surface of the substrate on which a referenced material or structure is located, and substantially perpendicular to a "lateral" direction. The "length" of a respective material or structure may be defined as a dimension in the longitudinal direction of the horizontal plane. With reference to the figures, the "longitudinal" direction may be parallel to an indicated "Y" axis, may be perpendicular to an indicated "X" axis, and may be perpendicular to an indicated "Z" axis.

As used herein, the term "vertical" means and includes a direction that is perpendicular to a primary surface of the substrate on which a referenced material or structure is located. The "height" of a respective material or structure may be defined as a dimension in a vertical plane. With reference to the figures, the "vertical" direction may be parallel to an indicated "Z" axis, may be perpendicular to an indicated "X" axis, and may be perpendicular to an indicated "Y" axis.

As used herein, the term "width" means and includes a dimension, along an indicated "X" axis in a horizontal plane (e.g., at a certain elevation, if identified), defining a maximum distance, along such "X" axis in the horizontal plane, of the material or structure in question.

As used herein, the term "length" means and includes a dimension, along an indicated "Y" axis in a horizontal plane (e.g., at a certain elevation, if identified), defining a maximum distance, along such "Y" axis in the horizontal plane, of the material or structure in question.

As used herein, the terms "thickness" or "thinness" are spatially relative terms that mean and include a dimension in a straight-line direction that is normal to the closest surface of an immediately adjacent material or structure that is of a different composition or that is otherwise distinguishable from the material or structure whose thickness, thinness, or height is discussed.

As used herein, the term "between" is a spatially relative term used to describe the relative disposition of one material or structure relative to at least two other materials or structures. The term "between" may encompass both a disposition of one material or structure directly adjacent the other materials or structures and a disposition of one material or structure indirectly adjacent to the other materials or structures.

As used herein, the term "proximate" is a spatially relative term used to describe disposition of one material or structure near to another material or structure. The term "proximate" includes dispositions of indirectly adjacent to, directly adjacent to, and internal to.

As used herein, the term "neighboring," when referring to a material or structure, is a spatially relative term that means and refers to a next, most proximate material or structure of an identified composition or characteristic. Materials or structures of other compositions or characteristics than the identified composition or characteristic may be disposed between one material or structure and its "neighboring" material or structure of the identified composition or characteristic. For example, a structure of material X "neighboring" a structure of material Y is the first material X structure, e.g., of multiple material X structures, that is most proximate to the particular structure of material Y. The "neighboring" material or structure may be directly adjacent or indirectly adjacent the structure or material of the identified composition or characteristic.

As used herein, the term "consistent"—when referring to a parameter, property, or condition of one structure, material, feature, or portion thereof in comparison to the parameter, property, or condition of another such structure, material, feature, or portion of such same aforementioned structure, material, or feature—is a relative term that means and includes the parameter, property, or condition of the two such structures, materials, features, or portions being equal, substantially equal, or about equal, at least in terms of respective dispositions of such structures, materials, features, or portions. For example, two structures having "consistent" thickness as one another may each define a same, substantially same, or about the same thickness at Y longitudinal distance from a feature, despite the two structures being at different elevations along the feature.

As used herein, the terms "about" and "approximately," when either is used in reference to a numerical value for a particular parameter, are inclusive of the numerical value and a degree of variance from the numerical value that one of ordinary skill in the art would understand is within acceptable tolerances for the particular parameter. For example, "about" or "approximately," in reference to a numerical value, may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "substantially," when referring to a parameter, property, or condition, means and includes the parameter, property, or condition being equal to or within a degree of variance from a given value such that one of ordinary skill in the art would understand such given value to be acceptably met, such as within acceptable manufacturing tolerances. By way of example, depending on the particular parameter, property, or condition that is substantially met, the parameter, property, or condition may be "substantially" a given value when the value is at least 90.0 percent met, at least 95.0 percent met, at least 99.0 percent met, or even at least 99.9 percent met.

As used herein, the terms "on" or "over," when referring to an element as being "on" or "over" another element, are spatially relative terms that mean and include the element being directly on top of, adjacent to (e.g., laterally adjacent to, horizontally adjacent to, longitudinally adjacent to, vertically adjacent to), underneath, or in direct contact with the other element. It also includes the element being indirectly on top of, adjacent to (e.g., laterally adjacent to, horizontally adjacent to, longitudinally adjacent to, vertically adjacent to), underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, any spatially relative terms used in this disclosure are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" may encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, the terms "level" and "elevation" are spatially relative terms used to describe one material's or feature's relationship to another material(s) or feature(s) as illustrated in the figures, using—as a reference point—the lowest illustrated surface of the structure that includes the materials or features. As used herein, a "level" and an "elevation" are each defined by a horizontal plane parallel to a primary surface of the substrate or base structure on or in which the structure (that includes the materials or features) is formed. "Lower levels" and "lower elevations" are relatively nearer to the bottom-most illustrated surface of the respective structure, while "higher levels" and "higher elevations" are relatively further from the bottom-most illustrated surface of the respective structure.

As used herein, the term "depth" is a spatially relative term used to describe one material's or feature's relationship to another material(s) or feature(s) as illustrated in the figures, using—as a reference point—the highest illustrated surface of the structure that includes the materials or features. As used herein, a "depth" is defined by a horizontal plane parallel to the highest illustrated surface of the structure that includes the materials or features.

Unless otherwise specified, any spatially relative terms used in this disclosure are intended to encompass different orientations of the materials in addition to the orientation as depicted in the figures. For example, the materials in the figures may be inverted, rotated, etc., with the "upper" levels and elevations then illustrated proximate the bottom of the page, the "lower" levels and elevations then illustrated proximate the top of the page, and the greatest "depths" extending a greatest vertical distance upward.

As used herein, the terms "comprising," "including," "having," and grammatical equivalents thereof are inclusive, open-ended terms that do not exclude additional, unrecited elements or method steps. These terms also include more restrictive terms "consisting of" and "consisting essentially of" and grammatical equivalents thereof. Therefore, a structure described as "comprising," "including," and/or "having" a material may be a structure that, in some embodiments, includes additional material(s) as well and/or a structure that, in some embodiments, does not include any other material(s). Likewise, a material (e.g., composition)

described as "comprising," "including," and/or "having" a species may be a material that, in some embodiments, includes additional species as well and/or a material that, in some embodiments, does not include any other species.

As used herein, the term "may" with respect to a material, structure, feature, or method act indicates that such is contemplated for use in implementation of an embodiment of the disclosure and such term is used in preference to the more restrictive term "is" so as to avoid any implication that other, compatible materials, structures, features, and methods usable in combination therewith should or must be excluded.

As used herein, "and/or" means and includes any and all combinations of one or more of the associated listed items.

As used herein, the singular forms "a," "an," and "the" are intended to include the plural forms as well, unless the context clearly indicates otherwise.

As used herein, a "(s)" at the end of a term means and includes the singular form of the term and/or the plural form of the term, unless the context clearly indicates otherwise.

As used herein, the terms "configured" and "configuration" mean and refer to a size, shape, material composition, orientation, and arrangement of a referenced material, structure, assembly, or apparatus so as to facilitate a referenced operation or property of the referenced material, structure, assembly, or apparatus in a predetermined way.

The illustrations presented herein are not meant to be actual views of any particular material, structure, substructure, region, sub-region, device, system, or stage of fabrication, but are merely idealized representations that are employed to describe embodiments of the disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or structures as illustrated but may include deviations in shapes that result, for example, from manufacturing techniques. For example, a structure illustrated or described as box-shaped may have rough and/or nonlinear features. Moreover, sharp angles that are illustrated may be rounded. Thus, the materials, features, and structures illustrated in the figures are schematic in nature and their shapes are not intended to illustrate the precise shape of a material, feature, or structure and do not limit the scope of the present claims.

The following description provides specific details, such as material types and processing conditions, to provide a thorough description of embodiments of the disclosed apparatus (e.g., devices, systems) and methods. However, a person of ordinary skill in the art will understand that the embodiments of the apparatus and methods may be practiced without employing these specific details. Indeed, the embodiments of the apparatus and methods may be practiced in conjunction with conventional semiconductor fabrication techniques employed in the industry.

The fabrication processes described herein do not form a complete process flow for processing apparatus (e.g., devices, systems) or the structures thereof. The remainder of the process flow is known to those of ordinary skill in the art. Accordingly, only the methods and structures necessary to understand embodiments of the present apparatus (e.g., devices, systems) and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching (e.g., dry etching, wet etching, vapor etching), ion milling, abrasive planarization, or other known methods.

In referring to the drawings, like numerals refer to like components throughout. The drawings are not necessarily drawn to scale.

With reference to FIG. 1A, FIG. 1B, and FIG. 1C, illustrated are structures 102a, 102b, and 102c, respectively, in elevational cross-sectional view at various points along a width of a microelectronic device structure 100 illustrated in top plan view in FIG. 1D. The elevational views of FIG. 1A, FIG. 1B, and FIG. 1C correspond to section lines A-A, B-B, and C-C, respectively, of FIG. 1D. The top plan view of FIG. 1D corresponds to the elevation indicated by section line D-D in FIG. 1A, FIG. 1B, and FIG. 1C. For ease of illustration, FIG. 1D does not illustrate dielectric material(s) 104 substantially filling space around other features of the microelectronic device structure 100.

The microelectronic device structure 100—and the structures 102a to 102c thereof—includes a stack 106 (which may be otherwise referred to herein as a "stack structure" or as a "tiered stack") of vertically alternating (e.g., vertically interleaved) insulative structures 108 and conductive structures 110 arranged in tiers 112. Each tier 112 may include one insulative structure 108 and one conductive structure 110.

While FIG. 1A to FIG. 1C illustrate about thirty (30) tiers 112 (e.g., thirty (30) conductive structures 110) in the stack 106, the disclosure is not so limiting. For example, a microelectronic device structure, in accordance with embodiments of the disclosure, may include a different quantity of the tiers 112 (e.g., and of the conductive structures 110) in the stack 106. In some embodiments, a number (e.g., quantity) of the tiers 112—and therefore of the conductive structures 110—of the stack 106 is within a range of from thirty-two of the tiers 112 (and of the conductive structures 110) to three-hundred or more of the tiers 112 (and of the conductive structures 110). In some embodiments, the stack 106 includes one-hundred twenty-eight of the tiers 112 (and of the conductive structures 110). However, the disclosure is not so limited, and the stack 106 may include a different number of the tiers 112 (and of the conductive structures 110).

The conductive structures 110 may be formed of and include (e.g., each be formed of and include) one or more conductive materials, such as one or more of: at least one metal (e.g., one or more of tungsten, titanium, nickel, platinum, rhodium, ruthenium, iridium, aluminum, copper, molybdenum, silver, gold), at least one alloy (e.g., an alloy of one or more of the aforementioned metals), at least one metal-containing material that includes one or more of the aforementioned metals (e.g., metal nitrides, metal silicides, metal carbides, metal oxides, such as a material including one or more of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof), at least one conductively-doped semiconductor material (e.g., conductively-doped silicon, conductively-doped germanium, conductively-doped silicon germanium), polysilicon, and at least one other material exhibiting electrical conductivity. In some embodiments, the conductive structures 110 include at least one of the aforementioned conductive materials along with at least one additional of the aforementioned conductive materials formed as a liner. Some or all of the conductive structures 110 may have the same (e.g., consistent) or different thicknesses (e.g., heights) as one another.

The insulative structures 108 may be formed of and include (e.g., each be formed of and include) at least one insulative material, such as a dielectric oxide material (e.g., silicon dioxide). In this and other embodiments described herein, the insulative material of the insulative structures 108 may be substantially the same as or different than other insulative material(s) of the microelectronic device structure 100. Some or all of the insulative structures 108 may have the same (e.g., consistent) or different thicknesses (e.g., heights) as one another. In some embodiments, some of the insulative structures 108 (e.g., an uppermost, a lowest, and/or intermediate insulative structures 108) may be relatively thicker than others of the insulative structures 108 in the stack 106.

The stack 106 is supported on (e.g., above) a source/drain region 114 on or within a base structure. The source/drain region 114 may be formed of and include, for example, one or more semiconductor materials (e.g., polycrystalline silicon (polysilicon)) doped with one or more P-type conductivity chemical species (e.g., one or more of boron, aluminum, and gallium) or one or more N-type conductivity chemical species (e.g., one or more of arsenic, phosphorous, and antimony).

In addition to the source/drain region 114, the base structure may include other base material(s) or structure(s), such as conductive regions for making electrical connections with other conductive structures of the device that includes the microelectronic device structure 100. In some such embodiments, CMOS (complementary metal-oxide-semiconductor) circuitry is included in a CMOS region below the source/drain region 114, which region may be characterized as a so-called "CMOS under Array" ("CuA") region.

Slit structures 116 extend through the stack 106 (e.g., through a full height of the stack 106, from lowest surface of the stack 106 to an uppermost surface of the stack 106) and to or into the source/drain region 114 to divide the stack 106 into dual-block structures 118. The dual-block structures 118 are further divided into a pair of blocks 120 by a trench 122 that extends to or into the source/drain region 114, as further discussed below. The trench 122 may be relatively narrow, compared to the slit structures 116. In some embodiments, the trench 122 may span a distance, between edges and sidewalls of the opposing blocks 120, of less than about 1600 nm (less than about 1.6 μm), e.g., less than about 1300 nm (less than about 1.3 μm). A critical dimension (CD) at a base of the trench 122 may be greater than about 400 nm. The longitudinal (e.g., Y-axis) dimension of the trench 122 may be less than (e.g., less than half) a longitudinal (e.g., Y-axis) dimension of one of the slit structures 116. The trench 122 may be substantially parallel to and substantially equidistant from the slit structures 116 bordering the dual-block structure 118.

At least one (e.g., one, some, or all) of the slit structures 116 may include one or more insulative liners 124 (e.g., formed of and including any one or more of the aforementioned insulative material(s)) and nonconductive fill material 126 (e.g., formed of and including any one or more of the aforementioned insulative material(s) and/or a semiconductive material(s), such as polysilicon). In some embodiments, sidewalls of the conductive structures 110 are laterally recessed, relative to the insulative structures 108, proximate the slit structures 116. In such embodiments, the insulative liner 124 of the slit structures 116 may laterally extend in correspondence with the lateral recesses of the conductive structures 110 of the tiers 112.

Other portions of the microelectronic device structure 100 (e.g., portions horizontally disposed relative to the portions illustrated in the figures) may include array(s) of pillars (e.g., including channel material and memory material) extending through the stack 106 and to and/or into the doped material of the source/drain region 114. The pillars may effectuate the formation of strings of memory cells of a memory device (e.g., a memory device including any of the microelectronic device structures described or illustrated herein). The conductive structures 110 of the tiers 112 may be coupled to, or may form control gates of, the memory cells effectuated by the pillars. For example, each conductive structure 110 may be coupled to one memory cell of a particular string (e.g., effectuated by a particular pillar) of memory cells.

To facilitate electrical communication to particular selected conductive structures 110 within the stack 106, conductive contact structures extend from and physically contact the conductive structures 110 of the tiers 112. Each such conductive contact structure is positioned to physically contact a particular one of the conductive structures 110 within a respective block 120 of the microelectronic device structure 100. The conductive contacts physically contact the respective conductive structures 110 at steps 128 (e.g., landing areas provided by exposed upper surfaces of the conductive structures 110). These conductive contact structures physically contacting the steps 128 may be referred to herein as "step contacts 130."

To provide one step 128 for each of the conductive structures 110 of the stack 106, the stack 106 is patterned (e.g., etched) to expose, in a respective block 120, one upper surface area portion of each conductive structure 110. That is, the tiers 112 in upper elevations of the stack 106 are selectively patterned to remove portions that leave exposed an area of a next lowest conductive structure 110, which exposed area provides a particular step 128 for the exposed conductive structure 110.

Because each conductive structure 110 in the stack 106 occupies a different elevation, the steps 128 are formed at the various elevations of the conductive structures 110. The step contacts 130 extend downward the various depths to the respective elevations of the respective steps 128. The microelectronic device structure 100 may include, in each respective block 120, at least one step contact 130 per step 128 and, therefore, at least one step contact 130 per conductive structure 110 in the stack 106.

The structure 102a illustrated in FIG. 1A corresponds to a first lateral position (section line A-A of FIG. 1D) of one dual-block structure 118 of the microelectronic device structure 100. The structure 102b illustrated in FIG. 1B corresponds to a second lateral position (section line B-B of FIG. JD) of the same dual-block structure 118. The structure 102c illustrated in FIG. 1C corresponds to a third lateral position (section line C-C of FIG. 1D) of the same dual-block structure 118.

The two blocks 120 of a respective dual-block structure 118 are substantially symmetrically structured, relative to one another, about the trench 122. Accordingly, for each step 128 exposing one conductive structure 110, another step 128 exposing the same conductive structure 110 is disposed across the trench 122 and opposite the first step 128. The opposing steps 128 provide what may be referred to herein as the "shoulders" or "cross-bars" of the "T" shape for which the trench 122 forms a "stem." In other words, the opposing steps 128 of the stack 106 are provided by a plateau of an upper surface of one conductive structure 110, with the plateau substantially equally divided by the trench 122. In some embodiments, such as that illustrated in FIG. 1A to FIG. 1F, each block 120 includes a single series of steps 128 to each longitudinal side of the trench 122. In other embodiments, such as those described further below, each block 120 includes multiple series of steps 128 to each longitudinal side of the trench 122.

Vertically, the trench 122 extends through lower elevations of the stack 106, from respective steps 128 to the base of the stack 106, to expose a portion of the source/drain region 114 at the bottom of the trench 122. Accordingly, while the slit structures 116 may extend through and are at least partially defined by a full height of the stack 106, the trenches 122 extend through and are defined by a partial height of the stack, e.g., the combined height of the tiers 112 of the stack 106 from respective steps 128 to the source/drain region 114. Moreover, the slit structures 116 may each be bordered by at least a portion of each tier 112 of the stack 106 and may define a consistent height along a width of the microelectronic device structure 100. In contrast, and as described further below, the height of the trench 122 may vary, across the width of the microelectronic device structure 100, in light of the steps 128—that border and define a top opening of the trench 122—being at different elevations in the stack 106.

A pair of the step contacts 130, one pair for each opposing pair of steps 128 of the dual-block structure 118, extends an appropriate depth so that each step contact 130 physically contacts a respective step 128. Therefore, each of the structures 102a through 102c illustrate a pair of the step contacts 130 extending a same depth in the respective structure 102a to 102c, respectively, (e.g., a depth relative to an upper surface of the slit structures 116 or a depth relative to an upper surface of the stack 106). For example, relative to an upper surface of the stack 106, the structure 102a of FIG. 1A includes a pair of step contacts 130 (one for each block 120 of the dual-block structure 118) extending to respective steps 128 at depth 132, the structure 102b of FIG. 1B includes step contacts 130 extending to respective steps 128 at depth 134, and the structure 102c of FIG. 1C includes step contacts 130 extending to respective steps 128 at depth 136.

To electrically connect the step contacts 130 to the source/drain region 114, each step contact 130 may be in electrical communication with a respective additional conductive contact structure that extends to the source/drain region 114, namely, an active source/drain contact 138. The electrical connection between one of the step contacts 130 and one of the active source/drain contacts 138 may be facilitated by conductive routing lines 140 extending from and between the step contact 130 and a conductive plug 142 on (e.g., directly on) the active source/drain contact 138.

One or more dielectric material(s) 104 (e.g., dielectric oxide(s), such as silicon dioxide; dielectric nitride(s), such as silicon nitride) may be formed to fill other space of the dual-block structure 118. The dielectric material(s) 104 may be directly adjacent and may horizontally surround the step contacts 130 and the active source/drain contacts 138. Accordingly, in some embodiments, the step contacts 130 and the active source/drain contacts 138 do not further include an insulative liner horizontally about conductive material of these contact structures. In other embodiments, some or all of any of the step contacts 130 and/or the active source/drain contacts 138 may further include an insulative liner horizontally surrounding the conductive material of these contacts.

The dielectric material(s) 104 may substantially fill space—not otherwise occupied by the stack 106, the step contacts 130, the active source/drain contacts 138, and/or other conductive features of the dual-block structure 118. In some embodiments, the dielectric material(s) 104 may extend above and over the upper surface of the stack 106. The dielectric material(s) 104 may be formed in one or more distinctive regions or may be formed in a unitary region within a respective dual-block structure 118. For ease of illustration the dielectric material(s) 104 is not illustrated in the views of FIG. 1D, FIG. 1E, and FIG. 1F.

Figure 1F:
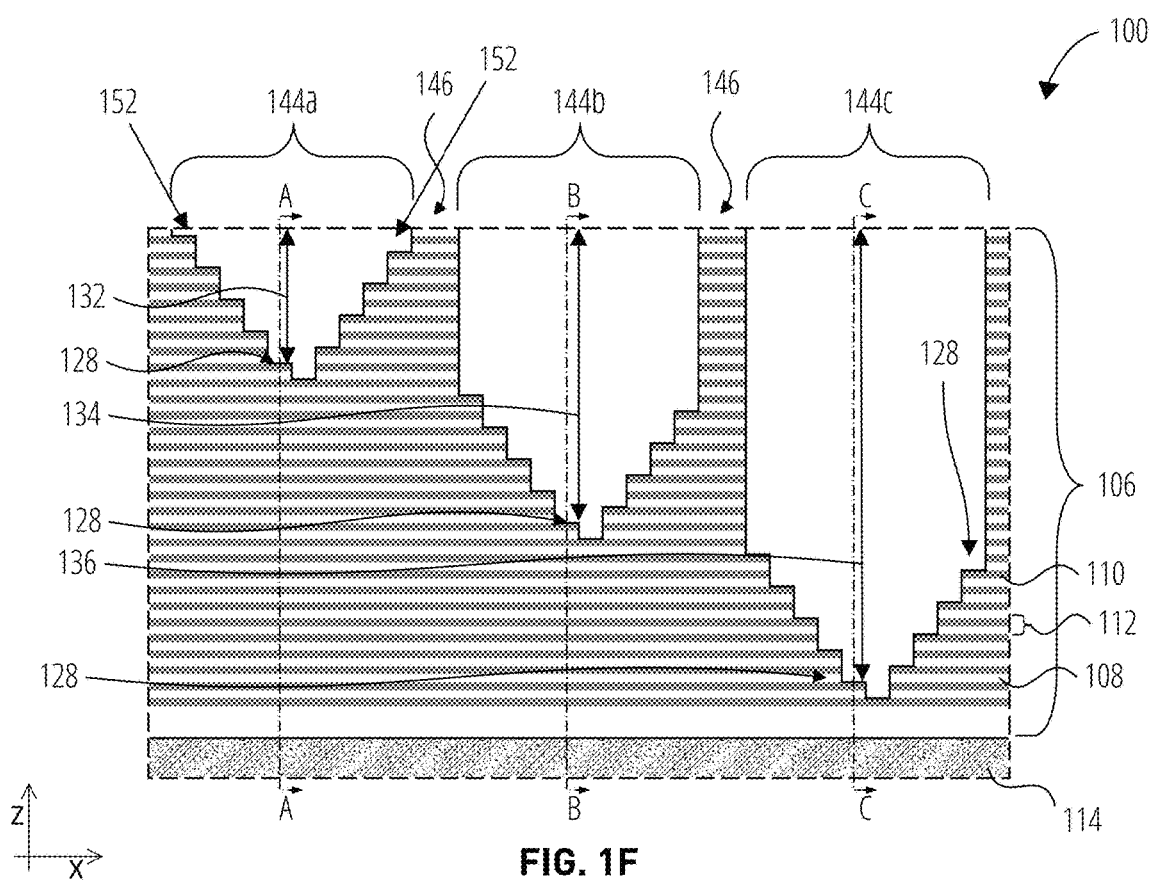
FIG. 1F is a view taken along section line F-F of FIG. 1D.

As illustrated in FIG. 1D, FIG. 1E, and FIG. 1F, the steps 128 may be formed and grouped in so-called "stadiums" (e.g., stadium 144a, stadium 144b, and stadium 144c). The microelectronic device structure 100 may include as many stadiums (e.g., stadium 144a to 144c), within a respective block 120, as necessary to include at least one step 128 per conductive structure 110 of the stack 106 (FIG. 1B). Each step 128 illustrated in a respective block 120 of FIG. 1D, FIG. 1E, and FIG. 1F is at a different elevation (e.g., conductive structure 110 (FIG. 1A)) of the stack 106 (FIG. 1B), as further described below. Like the steps 128, each respective stadium (e.g., stadium 144a) of a respective block 120 may have an opposing and symmetrically structured stadium (e.g., stadium 144a) of the other block 120 of the respective dual-block structure 118. Accordingly, pairs of opposing stadiums (e.g., opposing stadiums 144a, opposing stadiums 144b, and opposing stadiums 144c) may be symmetrically structured, relative to one another, about the trench 122. In other words, the series of stadiums 144a to 144c of one block 120 may be substantially symmetrically structured relative to the opposing series of stadiums 144a to 144c of the other block 120.

Non-patterned portions of the stack 106 (FIG. 1B) forming so-called "crests" (e.g., crests 146) are laterally interposed between neighboring stadiums (e.g., one crest 146 between stadium 144a and stadium 144b; another crest 146 between stadium 144b and stadium 144c, etc.) and may be laterally adjacent the first and last stadiums (e.g., stadium 144a and stadium 144c, respectively) of the series in a respective block 120.

Another non-patterned portion of the stack 106 (FIG. 1B), forming a so-called "bridge" 148, may remain against the sidewall, of the block 120, that is defined by the slit structure 116. The bridges 148 are included so that distal portions of a given conductive structure 110 remain in electrical communication along the width of the conductive structure 110 in the block 120.

The bridges 148 and crests 146 may be the result of patterning (e.g., etching) stages that form the slit structures 116 and the steps 128 while leaving at least one portion of the full height of the stack 106 extending substantially a full width of the block 120 (e.g., to form the bridge 148) and while leaving portions of the full height of the stack 106 extending substantially a full length of the block 120 (e.g., to form the crests 146). Accordingly, both the crests 146 and the bridges 148 may include portions of the stack 106 at the full height of the stack 106. The steps 128 of the block 120 may longitudinally extend toward the trench 122 from a respective bridge 148 and laterally extend toward an opposing step 128 from a respective crest 146.

As illustrated in FIG. 1D, the active source/drain contacts 138 are disposed within the trench 122 that divides each dual-block structure 118 into two blocks 120 and about which opposing stadiums (e.g., stadiums 144a) may be substantially symmetrically structured. In some embodiments, all active source/drain contacts 138 (e.g., all source/drain contacts that are in operative communication with step contacts 130) are disposed in the trench 122. With such placement, the active source/drain contacts 138 may be relatively closer to (e.g., with relatively less horizontal distance to) the step contacts 130 with which they are in operative communication than if, e.g., the active source/drain contacts 138 were formed in the crests 146 that separate neighboring stadiums (e.g., stadiums 144a and 144b) of a respective block 120. Accordingly, the crests 146 may be formed with a relatively smaller horizontal footprint and area than if the active source/drain contacts 138 were positioned in the crests 146. The disposition of the active source/drain contacts 138 in the trench 122, longitudinally between opposing stadiums (e.g., opposing stadiums 144a), may save footprint space of the microelectronic device structure 100, facilitating device scaling and increased efficiency. In other embodiments, at least one of the active source/drain contacts 138 is disposed in at least one crest 146 while others of the active source/drain contacts 138 are disposed in the trench 122.

The active source/drain contacts 138 in the trench 122 may extend substantially wholly and vertically through the dielectric material(s) 104 (FIG. 1A to FIG. 1C), rather than through portions of the stack 106 (FIG. 1B) that includes conductive structures 110. Therefore, an additional dielectric material (e.g., a dielectric liner) may be omitted from horizontally surrounding the active source/drain contacts 138, and the active source/drain contacts 138 may be in direct physical contact with the dielectric material(s) 104. The lack of a dielectric liner surrounding the active source/drain contacts 138 may further promote feature scaling and increased efficiency. In other embodiments, dielectric liner(s) may be included around the active source/drain contacts 138.

FIG. 1E is another top plan view of the microelectronic device structure 100 with additional features of the microelectronic device structure 100 illustrated, such as features not illustrated in FIG. 1D for ease of illustration therein. The view of FIG. 1E may be a view corresponding to a top-down view from above the stack 106 of the structures 102a to 102c of FIG. 1A to FIG. 1C, with added conductive routing lines 140 and without the dielectric material(s) 104 illustrated, for ease of illustration. The section A-A, section B-B, and section C-C lines are omitted from FIG. 1E, for ease of illustration, but would rightly be disposed in the same relative positions as in FIG. 1D.

As illustrated in FIG. 1E, conductive routing lines 140 may be included to electrically connect a respective active source/drain contact 138 to a respective step contact 130. For example, each conductive routing line 140 may extend from an area of physical contact with one step contact 130 to an area of physical contact with the conductive plug 142 atop a respective active source/drain contact 138. Accordingly, a respective one of the conductive routing lines 140 may extend substantially longitudinally (e.g., parallel to the indicated Y-axis or at an angle relative to the Y-axis, but, in at least some embodiments, not laterally parallel to the indicated X-axis) from an area above a respective one of the steps 128 to an area above the trench 122. The disposition of the active source/drain contacts 138 within the trench 122, longitudinally between opposing stadiums (e.g., stadiums 144a), may facilitate an arrangement of the conductive routing lines 140 that is relatively more direct and less crowded than if, e.g., the active source/drain contacts 138 were disposed in the crests 146 and the conductive routing lines 140 extended from step contacts 130 in the stadiums 144a to 144c laterally to a respective one of the crests 146.

FIG. 1E illustrates one possible arrangement of conductive routing lines 140 between step contacts 130 and respective active source/drain contacts 138, but the disclosure is not limited to this illustrated arrangement. Nonetheless, the disposition of the active source/drain contacts 138 within the trench 122 may accommodate a less complex and less crowded arrangement of the conductive routing lines 140. With less complexity and less crowding, fabrication of the conductive routing lines 140 according to a particular arrangement may be more reliable. Moreover, fabrication reliability may also be facilitated by inhibiting block bending, as described further below.

In some embodiments, non-active (e.g., "dummy" or "support") contacts may also be included in the microelectronic device structure 100. For example, support contacts 150 of substantially the same materials as the active source/drain contacts 138 may be included at various points along the width and length of the blocks 120 of the dual-block structure 118, whether of the same or different cross-sectional shape or area as that of the active source/drain contacts 138. In some such embodiments, the support contacts 150 are included in the crests 146 and/or in the trench 122 (e.g., between opposing crests 146), as illustrated in FIG. 1E. However, unlike the active source/drain contacts 138, the support contacts 150 need not be in physical or operational contact with conductive plugs 142 and/or conductive routing lines 140 (e.g., above and/or below). The illustrated arrangement of support contacts 150 in FIG. 1E is just one example, but the disclosure is not limited to this particular illustrated arrangement.

With reference to FIG. 1F, illustrated, in elevational and lateral cross-section is the microelectronic device structure 100 in correspondence to section line F-F of FIG. 1D. FIG. 1F illustrates, as described above, that each step 128 of the stadiums 144a to 144c is provided by a different one of the conductive structures 110 of the stack 106. A single stadium (e.g., stadium 144a) includes a pair of opposing staircases 152, each providing steps 128 at various (e.g., different) elevations of the conductive structures 110. However, the opposing staircases 152 are at least somewhat vertically offset from one another so that the conductive structures 110 exposed by the steps 128 of one of the staircases 152 (e.g., a descending staircase) are not the same conductive structures 110 exposed by the steps 128 of the opposing staircase 152 (e.g., an ascending staircase). The steps 128 of a respective stadium (e.g., stadium 144a to 144c) may be grouped according to similar elevations, with a first stadium (e.g., stadium 144a) providing steps 128 in staircases 152 in uppermost elevations of the stack 106, a second stadium (e.g., stadium 144b) defining steps 128 and staircases 152 in elevations just below the upper most elevations of the stack 106, and so on until a final stadium (e.g., stadium 144c) defines steps 128 and staircases 152 in the lowest elevations of the stack 106. According to the illustrated microelectronic device structure 100, in the structure 102a of FIG. 1A, the illustrated steps 128 at depth 132 may correspond steps 128 within the first stadium (e.g., stadium 144a) of FIG. 1F; in the structure 102b of FIG. 1B, the illustrated steps 128 at depth 134 may correspond to steps 128 within the second stadium (e.g., stadium 144b) of FIG. 1F; and, in the structure 102c of FIG. 1C, the illustrated steps 128 at depth 136 may correspond to steps 128 within the third stadium (e.g., stadium 144c) of FIG. 1F. It should be understood that any other step 128 and/or stadium (e.g., stadium 144a to 144c)

of FIG. 1F could be illustrated as in any of FIG. 1A, FIG. 1B, or FIG. 1C but with the steps 128 and base of the step contacts 130 at the appropriate different elevation, in accordance with the various depths illustrated in FIG. 1F.

Accordingly, disclosed is a microelectronic device comprising a stack structure. The stack structure comprises a vertically alternating sequence of insulative structures and conductive structures arranged in tiers. The microelectronic device also comprises a dual-block structure including a first and a second series of stadiums defined in the stack structure. The first series of stadiums is defined in the stack structure within a first block of the dual-block structure. The second series of stadiums is defined in the stack structure within a second block of the dual-block structure. The first series of stadiums and the second series of stadiums are substantially symmetrically structured about a trench at a center of the dual-block structure. The trench extends a width of the first series and the second series of stadiums. The stadiums—of the first series and of the second series of stadiums—have opposing staircase structures comprising steps at ends of the conductive structures of the stack structure. Conductive source/drain contact structures are in the trench and extend substantially vertically from a source/drain region at a floor of the trench.

With reference to FIG. 2A through FIG. 15C, illustrated are various stages for a method of forming a microelectronic device, such as one including the microelectronic device structure 100 of FIG. 1D, FIG. 1E, and FIG. 1F, and also including the structures 102a to 102c of FIG. 1A to FIG. 1C.

Figures 2A, 2B, 2C:
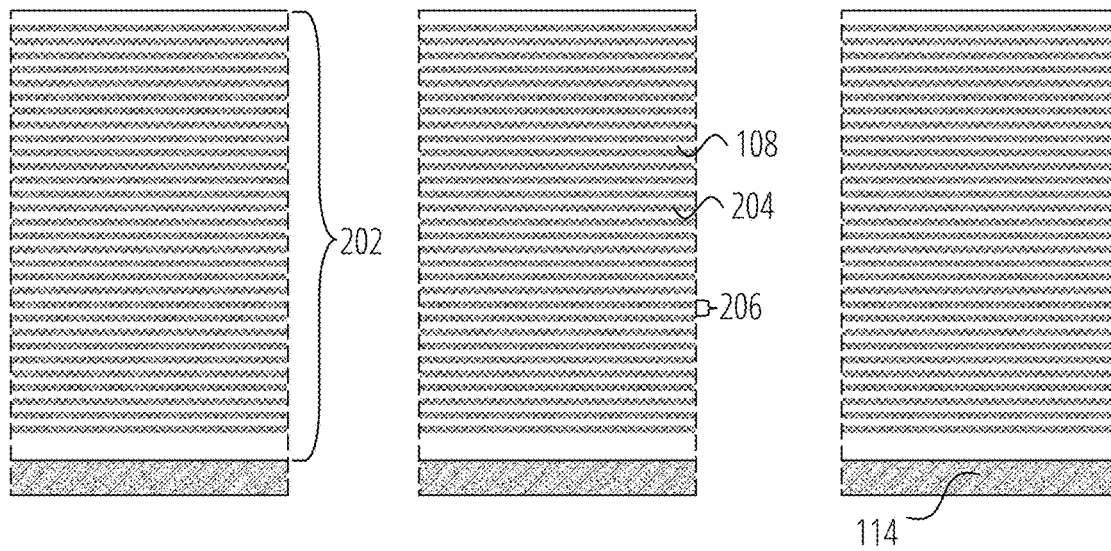

With reference to FIG. 2A, FIG. 2B, and FIG. 2C, a stack 202 (otherwise referred to herein as a "stack structure" or "tiered stack") is formed on a base structure that includes the source/drain region 114. The stack 202 is formed to include a vertically alternating sequence of the insulative structures 108 and sacrificial structures 204 arranged in tiers 206. The sacrificial structures 204 may be formed at elevations of the stack 202 that will eventually be replaced with or otherwise converted into the conductive structures 110 (e.g., FIG. 1A).

Sacrificial material(s) of the sacrificial structures 204 may be selected or otherwise formulated to be selectively removable (e.g., selectively etchable) relative to the insulative structures 108. In some embodiments, the insulative structures 108 comprise (e.g., each comprise) silicon dioxide and the sacrificial structures 204 comprise (e.g., each comprise) silicon nitride.

To form the stack 202, formation (e.g., deposition) of the insulative structures 108 may be alternated with formation (e.g., deposition) of the sacrificial structures 204. In some embodiments, the stack 202 may be formed, at this stage, to include as many tiers 206 with sacrificial structures 204 as there will be tiers 112 (FIG. 1A) with conductive structures 110 (FIG. 1A) in the final structure (e.g., the structures 102a to 102c of FIG. 1A to FIG. 1C and the microelectronic device structure 100 of FIG. 1D to FIG. 1F). One or more masks (e.g., hardmasks) may also be included on (e.g., above) the stack 202 and utilized in subsequent material-removal (e.g., etching, patterning) processes.

With reference to FIG. 3A, FIG. 3B, FIG. 3C, and FIG. 3D, the stack 202 is patterned to define a stadium opening 302 (e.g., an initial stadium opening) in the footprint area of each stadium to be formed (e.g., stadiums 144a to 144c of, e.g., FIG. 1F). Areas of the stack 202 for the crests 146 (FIG. 1F) and the bridges 148 (FIG. 1D) may not be etched so that they retain the full height of the stack 202.

As used herein the term "stadium opening" (e.g., as in the stadium openings 302 of FIG. 3A to FIG. 3D) means and includes an opening, defined by at least one pair of opposing staircases 152 with each staircase 152 including steps 128 at incrementally different elevations, defining the stadium opening to have incrementally changing (e.g., narrowing) horizontal lengths (e.g., Y-axis dimension) with incrementally deeper tier (e.g., tier 206) elevations.

The stadium opening 302 formed for each stadium (e.g., stadiums 144a to 144c of FIG. 1F) to be formed may have substantially the same staircase 152 elevational profile (e.g., elevational profile along the X-axis as illustrated in FIG. 3D) as the final staircase 152 elevational profiles (e.g., elevational profile along the X-axis as illustrated in FIG. 1F) for the respective stadiums. For example, as illustrated in FIG. 3D, each stadium opening 302 may be formed to include one pair of opposing staircases 152, each with some number (e.g., five) of steps 128, a consistent between-step rise of some number (e.g., two) of the sacrificial structures 204 (e.g., and, subsequently, the conductive structures 110 (FIG. 1A)), and with the descending staircase 152 offset from the ascending staircase 152 by an offset of some number (e.g., one) of sacrificial structures 204 (e.g., and, subsequently, the conductive structures 110 (FIG. 1A)). This may be the same staircase 152, step 128 number, rise number, and offset number as in the staircases 152 of the final stadium (e.g., stadium 144a of FIG. 3D and FIG. 1F, and stadiums 144b and 144c of FIG. 1F).

Except for the shallowest stadium (e.g., stadium 144a) of the series of stadiums for a respective block 120 (FIG. 1D), the stadium openings 302 and their staircase 152 structures and elevational profiles will be subsequently lowered to their final elevations, as described further below. In forming the initial stadium openings 302 in the same upper elevations of the stack 202, the same stadium opening 302 and staircase 152 profile may be defined in substantially the same upper elevations of the stack 202 for each stadium (e.g., stadiums 144a to 144c (FIG. 1F)) to be formed. Therefore, for example and as illustrated in FIG. 3A to FIG. 3D, in forming the initial stadium openings 302, a last step 128 of a descending staircase 152 of each stadium opening 302 may be formed at about the same depth (e.g., depth 132). Likewise, each third step in the ascending staircase 152 may be formed, in its respective initial stadium opening 302, at about the same depth, etc. Accordingly, the stadium openings 302 may be initially formed in substantially the same upper elevations of the stack 202 before being extended downward (e.g., except for the shallowest stadium 144a, which may not be any deeper than its initial stadium opening 302)—while substantially maintaining the elevational profile of the initially formed stadium openings 302, staircases 152, and steps 128—to final depths to complete the series of stadiums 144a to 144c (FIG. 1F) at their different depths, as described further below.

Figure 4A:
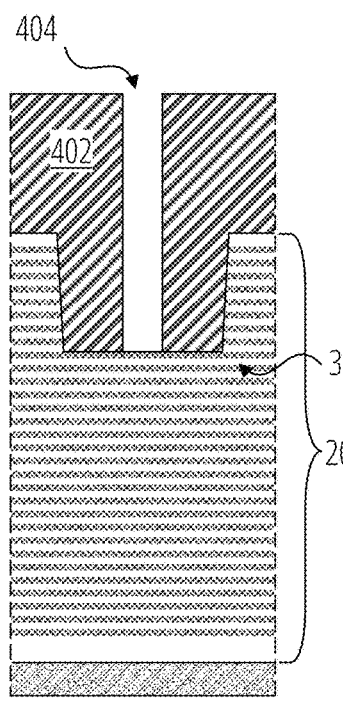
Figure 4B:
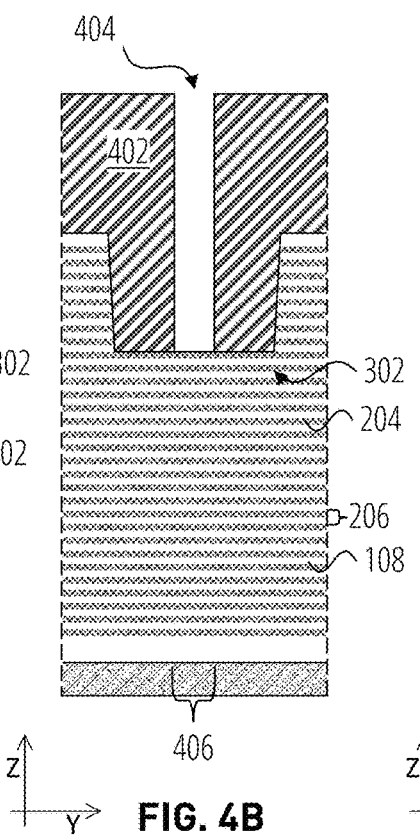
Figure 4C:
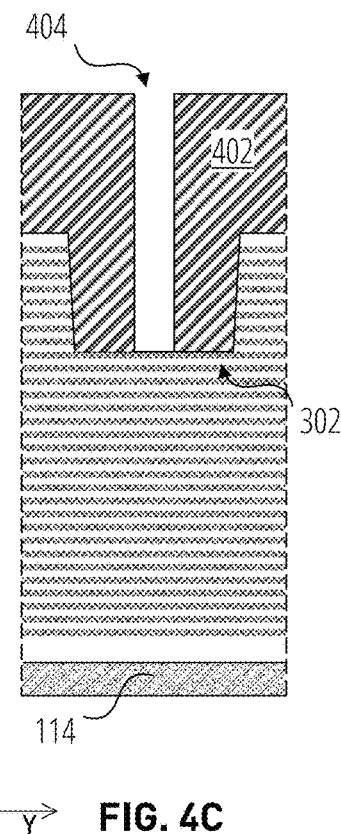

With reference to FIG. 4A, FIG. 4B, and FIG. 4C, photoresist material(s) 402 may be formed (e.g., deposited) in each of the stadium openings 302. The photoresist material(s) 402 may then be patterned (e.g., etched) to define a narrow opening 404 exposing an area 406 at the floor of the stadium openings 302. The area 406 may have substantially the horizontal dimensions of the trench 122 (FIG. 1A to FIG. 1C) to be formed. For example, like the final trench 122 to be formed (see FIG. 1A to FIG. 1C), the narrow opening 404 may extend substantially the width of the series of stadiums 144a to stadiums 144c (FIG. 1D) to be formed.

The narrow opening 404 may then be extended, as illustrated in in FIG. 5A, FIG. 5B, FIG. 5C, and FIG. 5D, a first extension distance 502—by etching further down into the stack 202, to form a first extended narrow opening 504 in the area 406 that will become the trench 122 (FIG. 1D). The first extended narrow opening 504 includes a partial trench 506 extending through some elevations of the stack 202 while an upper portion of the first extended narrow opening 504 extends through the photoresist material(s) 402.

Forming the first extended narrow opening 504 with its partial trench 506 separates each pair of opposing steps 128 in the stadium openings 302. In some embodiments, the partial trench 506 may be formed along the center the stadium openings 302 to divide what may otherwise be one step 128 into two opposing steps 128. In the narrowest stadium (e.g., stadium 144a of FIG. 1F), the steps 128 may already be at their final depths (e.g., depth 132 for the steps 128 of the structure 102a of FIG. 1A).

Because the stadium openings 302 were formed with the elevational profile of the staircases 152 across the floor of each stadium opening 302, extending the narrow opening 404 (FIG. 4A to FIG. 4C) to form the first extended narrow opening 504 and its partial trench 506 may maintain the same staircase 152 elevational profile in the area 406 at a narrow trench floor 508. Therefore, the narrow trench floor 508 of the first extended narrow opening 504 (and of the partial trench 506) may also have the staircase 152 elevational shape, as indicated by the dashed line of the narrow trench floor 508 in FIG. 5D. In the area 406 for the trench 122 (see FIG. 1D), each step 128 may be about the first extension distance 502 lower than a corresponding step 128 in the stadium openings 302 remaining on the longitudinal sides of the partial trench 506.

With reference to FIG. 6A, FIG. 6B, and FIG. 6C, in the not-yet-complete stadium areas (e.g., areas with stadium openings 302 not yet including steps 128 at their final depths), the photoresist material(s) 402 may be removed from the respective stadium openings 302 to form T-shaped openings 602 with the stadium openings 302 connecting to the partial trench 506. The photoresist material(s) 402 may remain in the completed stadium areas, e.g., areas of the stack 202 patterned with steps 128 already at their final depths (e.g., depth 132 for the steps 128 illustrated in FIG. 6A). In other embodiments, the photoresist material(s) 402 may be wholly removed from the structure and then reformed and re-patterned to provide the first extended narrow opening 504 in the completed stadium areas and the T-shaped openings 602 in the not-yet-completed stadium areas.

With the stack 202 exposed in the T-shaped openings 602 (both in the stadium openings 302 and in the partial trench 506) and in the first extended narrow opening 504 (including in the partial trench 506), the etching process may be continued to etch deeper into the stack 202 where the stack 202 is exposed (e.g., not covered by the photoresist material(s) 402), as illustrated in FIG. 7A, FIG. 7B, FIG. 7C, and FIG. 7D. The stack 202 may be consistently etched a second extension distance 702, carrying the staircases 152 elevational profile, already formed in previous stages, to deeper elevations of the stack 202. Along the width of the stack 202 in the area 406 of the partial trench 506, the narrow trench floor 508—with its staircases 152 elevational profile—may be lowered the second extension distance 702, retaining the staircases 152 and elevational profile previously formed in the area 406 in the stage illustrated in FIG. 5A to FIG. 5D. In the already-completed stadiums (e.g., stadium 144a), with staircases 152 and steps 128 already formed at their final depths (e.g., depth 132 for the steps 128 illustrated in the structure 102a of FIG. 1A), the stack 202 etching is extended only in the area 406 of the partial trench 506, forming a second extended narrow opening 704 as illustrated in FIG. 7A. In the areas for the not-yet-completed stadiums (e.g., stadiums 144b and 144c (FIG. 1F)), the stadium openings 302 are also lowered the second extension distance 702, forming extended T-shaped stadium openings 706 that retain the staircases 152 elevational profile initially formed in the stage illustrated in FIG. 3B to FIG. 3D. Forming the extended T-shaped stadium openings 706 may complete the formation of the second shallowest stadium (e.g., stadium 144b) with its steps 128 at depth 134.

The stages of FIG. 5A to FIG. 7D may be repeated for each remaining stadium to be completed. For example, as illustrated in FIG. 8A, FIG. 8B, and FIG. 8C, as stadiums are completed with their staircases 152 and steps 128 at their final depths, the photoresist material(s) 402 may be re-formed as needed in the completed stadiums and the photoresist material(s) 402 again patterned to expose only the area 406 (e.g., the partial trench 506) for the trench 122 (FIG. 1A to FIG. 1C) to be formed. The concurrently, the area of not-yet-complete stadiums (e.g., stadium areas with staircases 152 and steps 128 not yet at their final depths, such as for stadium 144c of FIG. 1F) may be re-exposed through the photoresist material(s) 402 (e.g., as illustrated in FIG. 8C) to re-form extended T-shaped stadium opening(s) (e.g., extended T-shaped stadium opening 706).

Then, as illustrated in FIG. 9A to FIG. 9D, the stadium openings 302 (in the exposed not-yet-complete stadium areas) and the partial trench 506 (in both complete and not-yet-complete stadium areas) are extended downward, forming further extended T-shaped stadium openings 902 and second extended narrow openings 904, respectively, by etching further into the stack 202 another distance to lower the staircases 152 and their steps 128 to the elevations of the next stadium to be completed.

When forming the final stadium (e.g., stadium 144c (FIG. 1F and FIG. 9D)), the stadium opening 302 may be extended downward a final extension distance 906, which may be at least a distance 708 (FIG. 7D) between the last highest elevation of the narrow trench floor 508 and the source/drain region 114. In area 406, the remaining portions of the stack 202 may be substantially wholly removed by this final extension, lowering and completing the trench 122 by removing the remaining stack 106 height of the final extension distance 906 or whatever portion 908 thereof previously remained. Therefore, in the final extension stage, all remaining portions of the stack 202 in the area 406 may be removed, forming the trench 122 with the narrow trench floor 508 exposing the source/drain region 114 and extending substantially the whole width of the series of stadiums (e.g., stadiums 144a to 144c).

The first extension distance 502 (FIG. 5A to FIG. 5C), used to form the initial partial trench 506, may have been selected or otherwise tailored to facilitate the final extension stage (e.g., the stage illustrated in FIG. 9A to FIG. 9D) to wholly clear the area 406 of the stack 202 while lowering the stadium opening 302 of the final stadium area to its final depths to complete the final stadium (e.g., stadium 144c including, e.g., the steps 128 at depth 136 of the structure 102c of FIG. 1C).

Methods according to the stages illustrated in FIG. 4A to FIG. 9D include forming the partial trench 506 (e.g., FIG. 5B) (and subsequently the trench 122 (e.g., FIG. 9B)) after forming the initial stadium openings 302 (e.g., FIG. 3A to FIG. 3D) in the upper elevations of the stack 202, but before extending the stadium openings 302 downward in repeated stages to form deeper and deeper stadiums (e.g., stadium 144b of FIG. 7D then stadium 144c of FIG. 9D). Accordingly, in the initial stage of forming the partial trench 506 (e.g., FIG. 5A to FIG. 5D), the stack 202 may be etched—in the area 406 for the trench 122—a consistent vertical distance (e.g., first extension distance 502 (FIG. 5A)) along the entire width of the area 406 that will become the trench 122. Then, the trench 122 may be extended as the deeper stadiums (e.g., stadiums 144b to 144c) are formed.

In other embodiments, the stadium openings 302 may be formed and extended downward—in the series of stages to lower the stadium openings 302 to lower and lower depths (e.g., as illustrated in stages FIG. 6A to FIG. 9D)—before the partial trench 506 (e.g., FIG. 5B) (or any other portion of the trench 122 (e.g., FIG. 9B)) is formed (e.g., etched) in the area 406 of the stack 202. In such embodiments, the partial trench 506 (e.g., FIG. 5B) may be formed (e.g., etched) and then the trench 122 may be completed (e.g., etching down to the source/drain region 114) in the area 406 of the stack 202 after the series of stadiums 144a to 144c is otherwise etched.

With all the stadiums (e.g., stadiums 144a to 144c of FIG. 1F) and the trench 122 formed (e.g., etched), remaining photoresist material(s) 402 may be removed from the structure. As illustrated in FIG. 10A, FIG. 10B, and FIG. 10C, the dielectric material(s) 104 may then be formed (e.g., deposited) to substantially fill the T-shaped trenches 154 (e.g., both the stadium openings 302 and the trench 122). The dielectric material(s) 104 may be formed above the stack 202 as well.

With reference to FIG. 11A, FIG. 11B, and FIG. 11C, the active source/drain contacts 138 are formed in the trench 122. In some embodiments, discrete openings are formed (e.g., etched) through the dielectric material(s) 104 to the source/drain region 114 at the narrow trench floor 508 at the base of the trench 122. One or more conductive materials (e.g., one or more metals, such as tungsten) may be formed (e.g., deposited, conformally deposited) in the discrete openings to form the active source/drain contact 138 in physical contact with, and extending substantially vertically from, the source/drain region 114. Because the active source/drain contacts 138 may be formed through substantially only the dielectric material(s) 104, in some embodiments no additional dielectric liner(s) are formed to horizontally surround the active source/drain contacts 138.

In embodiments in which the structure further includes support contacts 150 (FIG. 1E), the support contact 150 may be formed concurrently with, before, or after forming the active source/drain contacts 138. For example, additional discrete openings may be formed (e.g., through the dielectric material(s) 104, through the stack 202, or both) and additional conductive material (e.g., additional one or more metals, such as tungsten) formed (e.g., deposited, conformally deposited) to form the support contacts 150. Some, all, or none of the support contacts 150 may include a dielectric liner horizontally surrounding the conductive material(s) of the support contacts 150.

With reference to FIG. 12A, FIG. 12B, and FIG. 12C, a slit 1202 is formed (e.g., etched) for each slit structure 116 (FIG. 1D) of the microelectronic device structure 100 (e.g., FIG. 1D). Each slit 1202 is formed to extend through the stack 202 and to or into source/drain region 114 and/or other base material(s) below the stack 202. Forming the slits 1202 divides the stack 202 into the dual-block structures 118. In each dual-block structure 118, a pair of opposing blocks 120 is substantially symmetrically arranged and structured, relative to one another, about the trench 122.

Prior to formation of the slits 1202, the features of the structure (e.g., the etched portions of the stack 202) may be substantially symmetrically structured about the trench 122 in each respective dual-block structure 118 area. Accordingly, when the slits 1202 are formed, the material stresses and strains within the dual-block structure 118 may also be substantially symmetrically distributed across the dual-block structure 118, rather than imbalanced with more stress or stress to one side of the trench 122 than to the other. Therefore, upon forming the slits 1202, block bending (e.g., structural leaning away from vertical) of the dual-block structure 118 may be lessened or avoided.

Avoiding block bending may facilitate forming the slits 1202 and further features in their respective desired footprint area, rather than offset or misaligned from a target footprint area due to bending of the structure below. Accordingly, the slits 1202 may be formed in a manner that consistently retains a sufficient length of, e.g., the shortest (e.g., least Y-axis horizontal dimension) conductive structures 110 (e.g., conductive rails 156) in the bridges 148 at the sidewalls of the dual-block structure 118. Therefore, forming conductive rails 156 of relatively small longitudinal lengths may be accomplished with relatively more reliability and consistency across the series of dual-block structures 118, than if imbalanced structures and material strains and stresses were not lessened or avoided. It is also contemplated that the horizontal lengths and widths of other features (e.g., the steps 128) may also be scaled to relatively smaller dimensions and still be relatively more reliability and consistently formed due to the avoidance of material stress and strain imbalances in the design of the dual-block structure 118.

In the slits 1202, ends of the sacrificial structures 204 and ends of the insulative structures 108 are exposed. A "replacement gate" process may be performed, via the slits 1202, to at least partially (e.g., substantially) exhume the sacrificial material(s) of the sacrificial structures 204, leaving voids 1302 (e.g., void spaces, gaps)—as illustrated in FIG. 13A FIG. 13B, and FIG. 13C—vertically between the insulative structures 108.

In the voids 1302, the conductive material(s) of the conductive structures 110 are formed, as illustrated in FIG. 14A, FIG. 14B, and FIG. 14C, to form the tiers 112 of the stack 106. For example, one or more conductive material(s) (e.g., a single conductive material, a conductive liner and then another conductive material) may be formed in the voids 1302 (FIG. 13A to FIG. 13C) directly on the insulative structures 108 and directly horizontally adjacent the dielectric material(s) 104 in the T-shaped trenches 154 (e.g., in the stadium openings 302 and in the trench 122).

In the slits 1202, the material(s) of the slit structures 116 (FIG. 1A to FIG. 1E) may be formed to complete the slit structures 116, as illustrated in FIG. 15A, FIG. 15B, and FIG. 15C. For example, the insulative liner 124 may be formed (e.g., deposited) on sidewalls of the tiers 112 of the stack 106 (e.g., the sidewalls, of the dual-block structure 118, that extend in the X-axis direction). The insulative liner 124 may also be formed on the source/drain region 114 at the bottom of the slits 1202 (FIG. 14A to FIG. 14C). The nonconductive fill material 126 may be formed (e.g., deposited) to fill or substantially fill a remaining volume between the insulative liner 124 to complete the slit structures 116.

Before or after completing the slit structures 116, the step contacts 130 are formed to extend through the dielectric material(s) 104 in the stadium openings 302 to respective steps 128 at their respective depths (e.g., depths 132, 134, and 136).

The conductive plugs 142 (FIG. 1A to FIG. 1C and FIG. 1E) may be formed in physical contact on (e.g., atop) the active source/drain contacts 138 (but not in physical contact with any support contacts 150 (FIG. 1E)). The conductive routing lines 140 (FIG. 1E) may be formed to bring the active source/drain contacts 138 into operative communication with their respective step contacts 130. Accordingly, the microelectronic device structure 100 (FIG. 1D to FIG. 1F) and its structures 102a to 102c (FIG. 1A to FIG. 1C, respectively) are formed.

Accordingly, disclosed is a method of forming a microelectronic device. The method comprises forming a tiered stack on a base structure. The tiered stack comprises a vertically alternating sequence of insulative structures and other structures. A series of stadiums is formed in the tiered stack. A trench is formed through the tiered stack to the base structure to divide the series of stadiums into a first series of stadiums and a second series of stadiums substantially symmetrically structured relative to one another about the trench. Conductive contact structures are formed in the trench. The conductive contact structures extend vertically from the base structure.

In accordance with embodiments of the disclosure, the microelectronic devices and their structures (e.g., the microelectronic device structure 100 of FIG. 1D to FIG. 1F and the structures 102a to 102c of FIG. 1A to FIG. 1C) are formed with features and material stresses and strains substantially symmetrically arranged, in each respective dual-block structure 118, across a lateral (e.g., X-axis) centerline of the dual-block structure 118 (e.g., a centerline along which the trench 122 extends). Therefore, the devices and structures (e.g., the microelectronic device structure 100 (FIG. 1D to FIG. 1F) and structures 102a to 102c (FIG. 1A to FIG. 1C, respectively)) may be formed by method(s) configured to avoid or at least lessen the risk of block bending, which also facilitates relatively more reliable and consistent fabrication of features, including relatively small-scaled features. Still further, the horizontal proximity of the active source/drain contacts 138 to the steps 128 and stadiums 144a to 144c (FIG. 1D) may facilitate an arrangement of the conductive routing lines 140 (FIG. 1E) that is relatively more direct, shorter, less crowded, and more reliably formed and operated than if the active source/drain contacts 138 were disposed horizontally further from the steps 128 of the stadiums (e.g., stadiums 144a to 144c (FIG. 1E)), e.g., in the crests 146 (FIG. 1E). In some embodiments, the lessened complexity and crowding of the conductive routing lines 140 (FIG. 1E) may also facilitate including a greater quantity of active source/drain contacts 138 and respective step contacts 130 and steps 128 in each stadium 144a to 144c (FIG. 1E), which may enable scaling of the series of stadiums 144a to 144c (FIG. 1E).

With reference to FIG. 16A, FIG. 16B, FIG. 16C, FIG. 16D, FIG. 16E, and FIG. 16F, illustrated are structures 1602a (FIG. 16A), 1602b (FIG. 16B), and 1602c (FIG. 16C) of a microelectronic device structure 1600 (FIG. 16D to FIG. 16F) in which the number of steps 128 in a single stadium is effectively multiplied by including at least one step drop 1604 (e.g., a lateral division with one step 128 of one conductive structure 110 elevation at the upper end of the step drop 1604 and one step 128 of one conductive structure 110 elevation at the lower end of the step drop 1604). Steps 128 (e.g., in a first pair of opposing staircases 152) on the upper end of the step drop 1604 may be longitudinally recessed relative to the trench 122, extending from the bridge 148 to the step drop 1604. Steps 128 (e.g., in a second pair of opposing staircases 152) on the lower end of the step drop 1604 may extend from the step drop 1604 to the trench 122.

In some embodiments, more than one step drop 1604 may be included per stadium 1606a to 1606b to further multiply the number of steps 128 in the stadium 1606a to 1606b. In other words, each step drop 1604 effectively adds an additional pair of opposing staircases 152 within a respective stadium 1606a to 1606b.

In some embodiments, such as illustrated in FIG. 16A to FIG. 16C, the step drop 1604 may provide a step-to-step drop of a height of one tier 112. In other embodiments, the height of the step drop 1604 may be greater than one tier 112.

With the step drop 1604, at the cross-bar (or shoulders) of the T-shaped trench 154 (e.g., where the stadium openings 302 (e.g., FIG. 16B) meets the trench 122), there are multiple steps 128 (e.g., two steps 128) to each longitudinal side of the trench 122. Each step 128 is associated with a respective one of the step contacts 130. As in the microelectronic device structure 100 of FIG. 1A to FIG. 1F, the blocks 120 of the dual-block structure 118 are substantially symmetrically structured, relative to one another, about the trench 122.

Figure 16E:
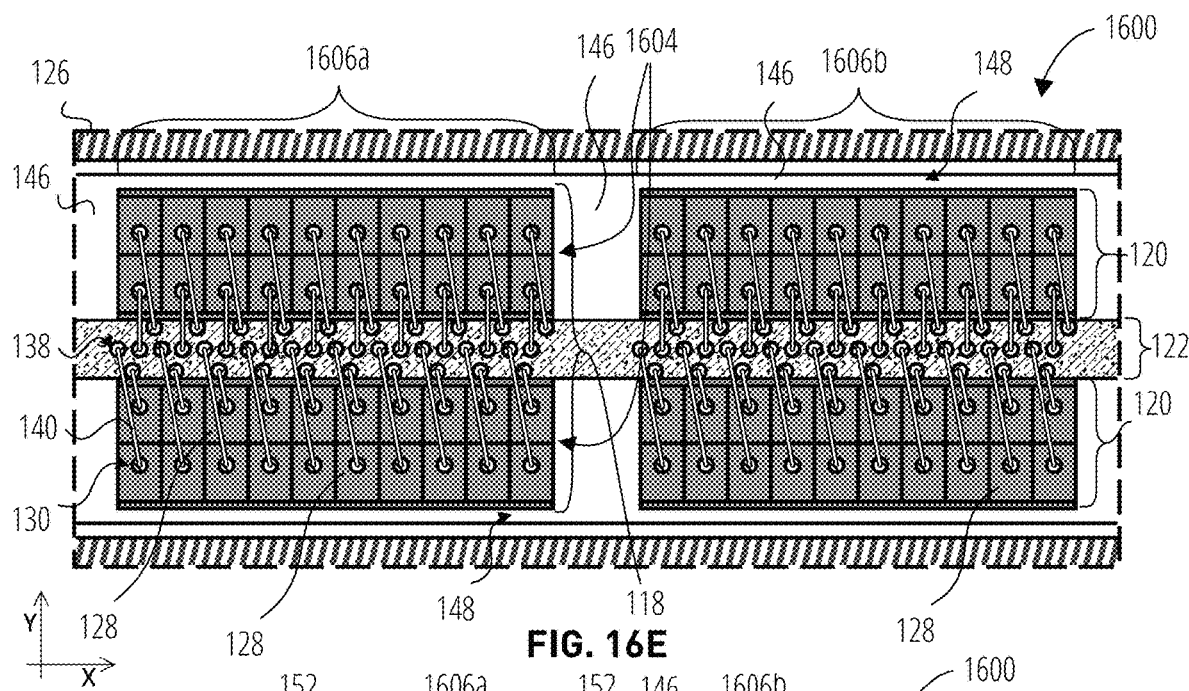

With the multiplied (e.g., doubled) number of steps 128 in each stadium 1606a to 1606b, and therefore the multiplied (e.g., doubled) number of step contacts 130 in each stadium 1606a to 1606b, the number of active source/drain contacts 138 in the trench 122 may also be multiplied (e.g., doubled). The active source/drain contacts 138 may be arranged in multiple lines or in other patterns along the trench 122. With reference to FIG. 16E, conductive routing lines 140 may be included to electrically connect one step contact 130 with its respective active source/drain contact 138. As with the microelectronic device structure 100 of FIG. 1A to FIG. 1F, the disposition of the active source/drain contacts 138 in the trench 122, between opposing stadiums 1606a to 1606b and horizontally proximate the step contacts 130, may facilitate an arrangement of the conductive routing lines 140 that is relatively more direct, less complex, and less crowded than if the active source/drain contacts 138 were disposed, e.g., in the crests 146.

The inclusion of the step drop 1604 to effectively multiply (e.g., double) the number of steps 128 in a given stadium (e.g., stadium 1606a, stadium 1606b) may enable including fewer stadiums (e.g., stadiums 1606a to 1606b) for a given number of conductive structures 110 in the stack 106. For example, if a stadium without a step drop 1604 (e.g., stadium 144a, 144b, or 144c of FIG. 1F) includes ten steps 128 (e.g., five steps 128 per staircase 152), a stadium with a step drop 1604 (e.g., stadium 1606a or 1606b of FIG. 16F) includes twenty steps 128 (e.g., ten steps 128 above the step drop 1604 and ten more steps 128 below the step drop 1604, or, in other words, ten steps 128 in each of two pairs of opposing staircases 152). Accordingly, the inclusion of at least one step drop 1604 may facilitate scaling the series of stadiums 1606a to 1606b.

The staircases 152 of the stadiums 1606a to 1606b may be relatively steeper than the staircases 152 of the microelectronic device structure 100 (see FIG. 1F). For example, the staircases 152 including the step drop 1604 may have a rise—between laterally neighboring steps 128 of a respective staircase 152—of greater than two tiers 112. The greater number of tiers in the rise of the staircase 152 accounts for the step drop 1604 providing steps 128 for the conductive structures 110 of two vertically adjacent tiers 112. Therefore, a rise of at least two-times the number of step drops 1604 in the staircase 152 may facilitate each step 128 of the stadium (e.g., stadium 1606a) being formed at a different conductive structure 110 elevation of the stack 106.

As with the microelectronic device structure 100 of FIG. 1E, the microelectronic device structure 1600 may further include support contacts 150 (not illustrated in FIG. 16E for ease of illustration) in any arrangement. Unlike the active source/drain contacts 138 in the trenches 122, the support contacts 150 may not be in contact with conductive plugs 142 (FIG. 16A to FIG. 16C) and may not be in operational contact with conductive routing lines 140 (FIG. 16E).

Accordingly, disclosed is a microelectronic device comprising a stack structure comprising insulative structures vertically interleaved with conductive structures and arranged in tiers. A pair of slit structures extends through the stack structure to a source/drain region below the stack structure. A trench is between the first slit structure and a second slit structure of the pair of slit structures. The trench extends through the stack structure to the source/drain region. A first series of staircased stadiums is defined in the stack structure between the first slit structure and the trench. A second series of staircased stadiums is defined in the stack structure between the second slit structure and the trench. Conductive contact structures are disposed in the trench and extend from the source/drain region. The first series of staircased stadiums is substantially symmetrically structured to the second series of staircased stadiums.

Figure 16F:
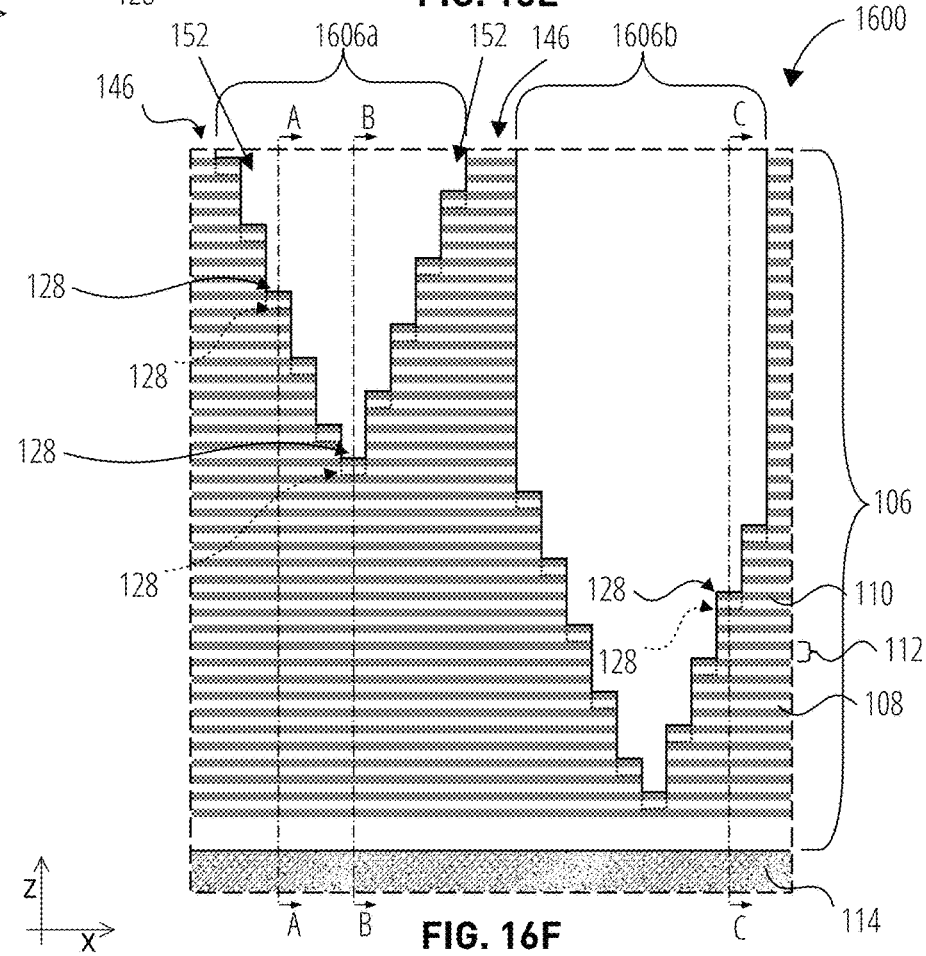
FIG. 16F is a view taken along section line F-F of FIG. 16D.

With reference to FIG. 17A to FIG. 21D, illustrated are various stages for forming a microelectronic device, such as one including the microelectronic device structure 1600 of FIG. 16D to FIG. 16F and also including the structures 1602a to 1602c of FIG. 16A to FIG. 16C. The stage illustrated in FIG. 17A, FIG. 17B, FIG. 17C, and FIG. 17D may follow that illustrated in FIG. 2A to FIG. 2C, e.g., formation of the stack 202.

The stack 202 is patterned to define the stadium openings 302 in a manner similar to that described above with regard to the stage illustrated in FIG. 3A to FIG. 3D. However, the stadium openings 302 formed according to this embodiment may be of a relatively greater Y-axis dimension to accommodate the multiplication of the steps 128 (FIG. 16C) by the step drop 1604 (FIG. 16C), and the staircases 152 provided by the stadium openings 302 may be relatively steeper, as described above.

The stadium openings 302 are formed—in the upper elevations of the stack 202 for each stadium to be formed—to initially exhibit the elevational profile of the staircases 152 that will be above the step drop 1604 (FIG. 16C) in the shallowest stadium 1606a (FIG. 16F) of the stadium series. For example, in the initially-formed stadium openings 302, a third step 128 of a descending staircase 152 in the stadium area 1702a for the shallowest stadium 1606a (FIG. 16F) may be formed at depth 1704 as illustrated in FIG. 17A and FIG. 17D; a bottom (e.g., first) step 128 of an ascending staircase 152 in the stadium area 1702a may be formed at depth 1706 as illustrated in FIG. 17B and FIG. 17D; and a fourth step 128 (from the bottom, or second step 128 from the top) of an ascending staircase 152 in the stadium area 1702b for the stadium 1606b may be formed at depth 1708 as illustrated in FIG. 17C and FIG. 17D.

With reference to FIG. 18A, FIG. 18B, and FIG. 18C, the photoresist material(s) 402 may be formed in the stadium openings 302 in a manner substantially similar to that described above with regard to the stage illustrated in FIG. 4A to FIG. 4C. However, the photoresist material(s) 402 may be patterned, in each stadium area 1702a to 1702b (FIG. 17D) to define an opening 1802 with a length (e.g., Y-axis dimension) substantially equal to the distance between the step drops 1604 (FIG. 16C) to be formed in opposing stadiums (e.g., stadium 1606a in a first and second block 120 of FIG. 16D).

The opening 1802 may be extended downward a depth of about one tier 206 to form extended openings 1902, as illustrated in FIG. 19A, FIG. 19B, FIG. 19C, and FIG. 19D. For example, the stack 202 may be etched for a relatively short time period to remove substantially only one level of sacrificial structure 204 and one level of insulative structure 108 to form the step drops 1604 with a drop of one tier 206 at both longitudinal sides of the extended openings 1902. This provides the steps 128 on the upper end of the step drop 1604 and a plateau for the steps 128 on the lower end of the step drop 1604. In forming the step drop 1604, substantially the same staircase 152 elevational profile may be consistently lowered the height of about one tier 206, across the width of each extended opening 1902, as illustrated in by the dashed lines of FIG. 19D. In subsequent extensions of this elevational profile in the stadium openings 302, the one-tier step drop 1604 may be maintained as the elevational profiles are extended to lower and lower depths for forming deeper and deeper stadiums (e.g., stadium 1606b of FIG. 16F).

After defining the step drop 1604, formation of the trench 122 (FIG. 16A to FIG. 16C) may be initiated to divide the plateau on the lower end of the step drop 1604 into opposing steps 128 of opposing stadiums (e.g., opposing stadiums 1606a (FIG. 16D)). For example, as illustrated in FIG. 20A, FIG. 20B, and FIG. 20C, the photoresist material(s) 402 may be reformed and re-patterned, as necessary, to define the narrow openings 404 in the area 406 to become the trench 122 (FIG. 16A to FIG. 16C), in a manner substantially similar to that described above with respect to the stage illustrated in FIG. 4A to FIG. 4C. The narrow openings 404 may be extended to form the first extended narrow opening 504—as illustrated in FIG. 21A, FIG. 21B, and FIG. 21C—and to form the partial trench 506 with the narrow trench floor 508 in the area 406 that will become the trench 122 (FIG. 16A to FIG. 16E)—as illustrated in FIG. 21D—in a manner substantially similar to that described above with respect to the stage illustrated in FIG. 5A to FIG. 5D.

The method for completing the formation of the microelectronic device structure 1600 of FIG. 16D to FIG. 16F and the structures 1602a to 1602c of FIG. 16A to FIG. 16C may continue in substantially the same way as described above with regard to the stages illustrated in FIG. 6A to FIG. 15C, including lowering the elevational profile of the stadium openings 302 and the partial trench 506 deeper and deeper for not-yet-completed stadium areas. As with the formation of the microelectronic device structure 100 of FIG. 1D to FIG. 1F, the substantially symmetrical structure of the blocks 120 (and opposing stadiums 1606a to 1606b) of the dual-block structures 118 of the microelectronic device structure 1600 may avoid block bending during fabrication, facilitating more reliable feature formation and scaling of structure features.

Accordingly, disclosed is a method of forming a microelectronic device. The method comprises forming—on a base structure—a stack of insulative structures vertically interleaved with other structures and arranged in tiers. In upper elevations of the stack, a series of stadium openings is formed. The stadium openings define opposing staircases. The opposing staircases of each stadium opening of the series has an elevational profile substantially the same as that of other opposing staircases of the stadium openings of the series. A trench is formed through additional elevations of the stack and extends along the series of stadium openings to divide the series of stadium openings into a first series of stadiums and a second series of stadiums. The second series of stadiums is substantially symmetrically structured relative to the first series of stadiums. At least some stadiums of the first series and the second series are extended to different depths in the stack. The at least some stadiums substantially retain the elevational profile of the opposing staircases after the extending. While extending at least some stadiums, the trench is extended to expose the base structure between the first series of stadiums and the second series of stadiums. A series of conductive contact structures is formed in the trench. The conductive contact structures extend from the base structure. A pair of slits is formed through the stack. The slits are formed to be substantially parallel to the trench. Each slit of the pair of slits is spaced from a neighboring one of the first series of stadiums and the second series of stadiums by a bridge portion of the stack.

Figure 22:
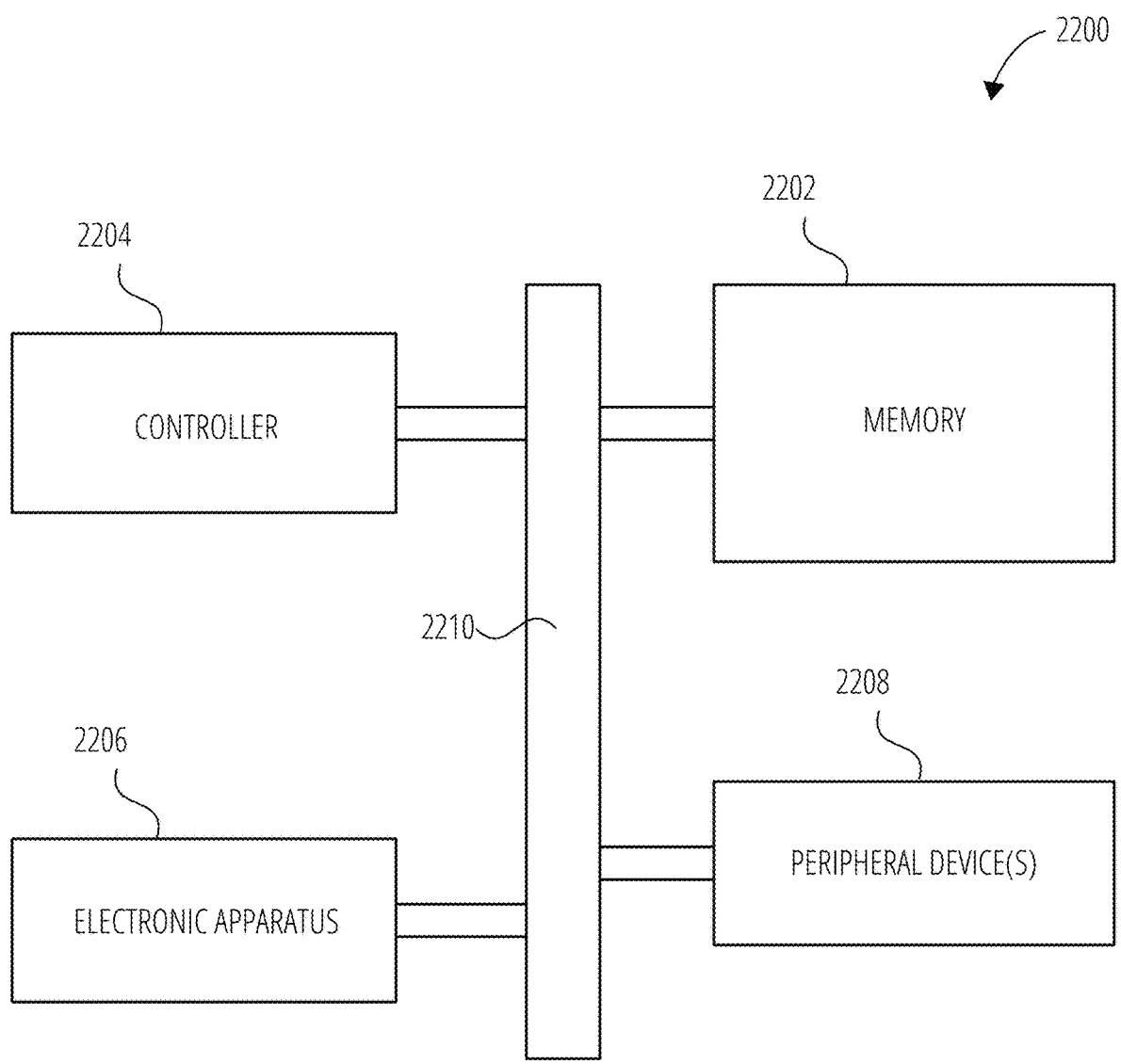
FIG. 22 is a block diagram of an electronic system including a microelectronic device that includes at least one microelectronic device structure of embodiments of the disclosure.

FIG. 22 shows a block diagram of a system 2200, according to embodiments of the disclosure, which system 2200 includes memory 2202 including arrays of vertical strings of memory cells adjacent microelectronic device structure (e.g., microelectronic device structure 100 of FIG. 1D to FIG. 1F and including structures 102a to 102c of FIG. 1A to FIG. 1C; microelectronic device structure 1600 of FIG. 16D to FIG. 16F and including structures 1602a to 1602c of FIG. 16A to FIG. 16C). Therefore, the architecture and structure of the memory 2202 may include one or more device structures according to embodiments of the disclosure and may be fabricated according to one or more of the methods described above (e.g., with reference to FIG. 2A to FIG. 15C and/or FIG. 17A to FIG. 21D).

The system 2200 may include a controller 2204 operatively coupled to the memory 2202. The system 2200 may also include another electronic apparatus 2206 and one or more peripheral device(s) 2208. The other electronic apparatus 2206 may, in some embodiments, include one or more of the microelectronic device structure 100 of FIG. 1D to FIG. 1F (including structures 102a to 102c of FIG. 1A to FIG. 1C) or the microelectronic device structure 1600 of FIG. 16D to FIG. 16F (including structures 1602a to 1602c of FIG. 16A to FIG. 16C), according to embodiments of the disclosure and fabricated according to one or more of the methods described above. One or more of the controller 2204, the memory 2202, the other electronic apparatus 2206, and the peripheral device(s) 2208 may be in the form of one or more integrated circuits (ICs).

A bus 2210 provides electrical conductivity and operable communication between and/or among various components of the system 2200. The bus 2210 may include an address bus, a data bus, and a control bus, each independently configured. Alternatively, the bus 2210 may use conductive lines for providing one or more of address, data, or control, the use of which may be regulated by the controller 2204. The controller 2204 may be in the form of one or more processors.

The other electronic apparatus 2206 may include additional memory (e.g., with one or more of the microelectronic device structure 100 of FIG. 1D to FIG. 1F (including structures 102a to 102c of FIG. 1A to FIG. 1C) or the microelectronic device structure 1600 of FIG. 16D to FIG. 16F (including structures 1602a to 1602c of FIG. 16A to FIG. 16C), according to embodiments of the disclosure and fabricated according to one or more of the methods described above). Other memory structures of the memory 2202 and/or the other electronic apparatus 2206 may be configured in an architecture other than 3D NAND, such as dynamic random access memory (DRAM), static random access memory (SRAM), synchronous dynamic random access memory (SDRAM), synchronous graphics random access memory (SGRAM), double data rate dynamic ram (DDR), double data rate SDRAM, and/or magnetic-based memory (e.g., spin-transfer torque magnetic RAM (STT-MRAM)).

The peripheral device(s) 2208 may include displays, imaging devices, printing devices, wireless devices, additional storage memory, and/or control devices that may operate in conjunction with the controller 2204.

The system 2200 may include, for example, fiber optics systems or devices, electro-optic systems or devices, optical systems or devices, imaging systems or devices, and information handling systems or devices (e.g., wireless systems or devices, telecommunication systems or devices, and computers).

Accordingly, disclosed is an electronic system comprising a three-dimensional memory device, at least one processor in operable communication with the three-dimensional memory device, and at least one peripheral device in operable communication with the at least one processor. The three-dimensional memory device comprises a stack structure comprising conductive structures vertically alternating with insulative structures and arranged in tiers. Slit structures extend through the stack structure to a source/drain region. The slit structures divide the stack structure into dual-block structures. At least one of the dual-block structures comprises a pair of blocks defining a series of stadiums having opposing staircase structures. The series of stadiums of the pair of blocks is substantially symmetrically structured relative to one another about a trench. The trench extends through the stack structure to the source/drain region. A series of conductive contact structures is in the trench and extends to the source/drain region.

While the disclosed structures, apparatus (e.g., devices), systems, and methods are susceptible to various modifications and alternative forms in implementation thereof, specific embodiments have been shown by way of example in the drawings and have been described in detail herein. However, the disclosure is not intended to be limited to the particular forms disclosed. Rather, the disclosure encompasses all modifications, combinations, equivalents, variations, and alternatives falling within the scope of the disclosure as defined by the following appended claims and their legal equivalents.

What is claimed is:

1. A microelectronic device, comprising:
    a stack structure comprising a vertically alternating sequence of insulative structures and conductive structures arranged in tiers;
    a pair of slit structures vertically and laterally extending through the stack structure;
    a dual-block structure between the pair of slit structures, the dual-block structure comprising:
        a first series of stadiums defined in the stack structure within a first block of the dual-block structure; and
        a second series of stadiums defined in the stack structure within a second block of the dual-block structure,
        the first series of stadiums and the second series of stadiums being substantially symmetrically structured about a trench at a center of the dual-block structure, the trench laterally extending a width of the first series and the second series of stadiums,
        the stadiums of the first series and of the second series of stadiums having opposing staircase structures comprising steps at ends of the conductive structures of the stack structure, within individual of the stadiums, the steps laterally ascending or laterally descending to define the staircase structures of the stadiums; and conductive source/drain contact structures in the trench, extending substantially vertically from a source/drain region at a floor of the trench.

2. The microelectronic device of claim 1, further comprising:

conductive step contact structures extending from the steps of the opposing staircase structures; and conductive routing lines operatively connecting the conductive step contact structures to the conductive source/drain contact structures.

3. The microelectronic device of claim 2, further comprising at least one crest portion of the stack structure, the at least one crest portion disposed laterally between one stadium of the first series of stadiums and another stadium of the first series of stadiums, the at least one crest portion extending a full height of the stack.

4. The microelectronic device of claim 3, wherein the at least one crest portion is substantially free of the conductive source/drain contact structures.

5. The microelectronic device of claim 2, wherein at least some of the conductive routing lines extend substantially longitudinally from above the steps to above the trench.

6. The microelectronic device of claim 1, further comprising a dielectric material within the first series of stadiums, within the second series of stadiums, and within the trench.

7. The microelectronic device of claim 6, wherein the conductive source/drain contact structures extend through the dielectric material in direct physical contact with the dielectric material.

8. The microelectronic device of claim 6, further comprising conductive step contacts extending to the steps through the dielectric material in direct physical contact with the dielectric material.

9. The microelectronic device of claim 1, wherein the pair of slit structures are along sidewalls of the dual-block structure, the pair of slit structures comprising:

a first slit structure horizontally adjacent the first series of stadiums and extending through a full height of the stack structure; and a second slit structure horizontally adjacent the second series of stadiums and extending through a full height of the stack structure.

10. The microelectronic device of claim 1, further comprising:

a first bridge of the stack structure, the first bridge being interposed between the first series of stadiums and a first slit structure, of the pair of slit structures, extending through a full height of the stack structure; and a second bridge of the stack structure, the second bridge being interposed between the second series of stadiums and a second slit structure, of the pair of slit structures, extending through a full height of the stack structure.

11. The microelectronic device of claim 1, wherein the trench spaces the first series of stadiums from the second series of stadiums by a distance of less than about 1.3 µm.

12. The microelectronic device of claim 1, wherein each step of the steps of the opposing staircase structures longitudinally extends directly from a bridge portion of the stack structure to the trench.

13. The microelectronic device of claim 1, wherein:

some steps, of the steps of the opposing staircase structures, longitudinally extend directly from a bridge portion of the stack structure to a step edge longitudinally recessed from the trench; and other steps, of the steps of the opposing staircase structures, longitudinally extend directly from the step edge to the trench.

14. A microelectronic device, comprising:

a stack structure comprising insulative structures vertically interleaved with conductive structures and arranged in tiers;

a pair of slit structures vertically extending through the stack structure to a source/drain region below the stack structure;

a trench between a first slit structure and a second slit structure of the pair of slit structures, the trench vertically extending through the stack structure to the source/drain region, the trench horizontally extending in a lateral direction substantially parallel to the first slit structure and the second slit structure;

a first series of staircased stadiums defined in the stack structure between the first slit structure and the trench;

a second series of staircased stadiums defined in the stack structure between the second slit structure and the trench; and conductive contact structures disposed in the trench and extending from the source/drain region, the staircased stadiums of the first series and of the second series individually comprising at least one set of steps ascending or descending in the lateral direction substantially parallel to the trench, the first series of staircased stadiums being substantially symmetrically structured relative to the second series of staircased stadiums.

15. The microelectronic device of claim 14, wherein the staircased stadiums of the first series and of the second series of staircased stadiums each comprise a pair of opposing staircases with a substantially same elevational profile as other pairs of opposing staircases of the staircased stadiums of the first series and of the second series of staircased stadiums.

16. The microelectronic device of claim 15, wherein the pair of opposing staircases individually comprises two of the at least one set of steps ascending or descending in the lateral direction, the two consisting of:

one set of the steps descending in the lateral direction; and one set of the steps ascending in the lateral direction, each of the steps being defined by a surface area of an end of a different one of the conductive structures.

17. The microelectronic device of claim 15, wherein the pair of opposing staircases individually comprises multiple sets of the at least one set of steps ascending or descending in the lateral direction, each of the steps being defined by a surface area of an end of a different one of the conductive structures.

18. The microelectronic device of claim 14, further comprising additional conductive contact structures within the staircased stadiums of the first series and the second series of staircased stadiums, the additional conductive contact structures each extending to a different one of the conductive structures of the stack structure.

19. The microelectronic device of claim 18, further comprising:

dielectric material within horizontal areas of each of the first series of staircased stadiums, the second series of staircased stadiums, and the trench, wherein the conductive contact structures and the additional conductive contact structures extend through the dielectric material without an interposing insulative liner.

20. A method of forming a microelectronic device, the method comprising:
  forming a stack structure on a source/drain region, the stack structure comprising a vertically alternating sequence of insulative structures and other structures arranged in tiers;
  forming a series of stadiums in the stack structure;
  forming a trench through the stack structure to the source/drain region to divide the series of stadiums into a first series of stadiums and a second series of stadiums substantially symmetrically structured relative to one another about the trench, the trench laterally extending a width of the first series and the second series of stadiums;
  forming conductive contact structures in the trench, the conductive contact structures extending substantially vertically from the source/drain region at a floor of the trench;
  forming a pair of slit structures vertically and laterally extending through the stack structure to form a dual-block structure between the pair of slit structure, the dual-block structure comprising:
    the first series of stadiums defined in the stack structure within a first block of the dual-block structure; and
    the second series of stadiums defined in the stack structure within a second block of the dual-block structure,
    the first series of stadiums and the second series of stadiums being substantially symmetrically structured about the trench at a center of the dual-block structure,
    the stadiums of the first series and of the second series of stadiums having opposing staircase structures comprising steps at ends of the other structures of the stack structure,
    within individual of the stadiums, the steps laterally ascending or laterally descending to define the staircase structures of the stadiums; and
  substantially replacing the other structures with conductive structures.

21. The method of claim 20, wherein forming the series of stadiums in the stack structure comprises:
  forming a series of stadium openings in upper elevations of the stack structure, the stadium openings having a same elevational profile as one another; and
  extending at least some of the stadium openings to different elevations of the stack structure while substantially retaining the elevational profile.

22. The method of claim 21, wherein forming the trench through the tiered stack structure comprises, prior to extending at least some of the stadium openings, forming an initial trench partially through the stack structure, the initial trench extending along substantially a center of the series of stadium openings.

23. The method of claim 22, wherein forming the trench through the stack structure further comprises, while extending at least some of the stadium openings to the different elevations of the stack structure, extending a depth of the initial trench to the source/drain region.

24. The method of claim 21, wherein:
  forming the series of stadium openings in the upper elevations of the stack structure comprises forming, for each opposing pair of stadiums of the first series of stadiums and the second series of stadiums to be formed, a single pair of opposing staircases for each opposing pair of stadiums of the first series of stadiums and the second series of stadiums to be formed;
  forming the trench through the stack structure to the source/drain region comprises dividing the single pair of opposing staircases into:
    a first pair of opposing staircases for each stadium of the first series of stadiums; and
    a second pair of opposing staircases for each stadium of the second series of stadiums; and
  extending the at least some of the stadium openings to the different elevations of the stack structure comprises extending the first pairs of opposing staircases and the second pairs of opposing staircases to the different elevations.

25. The method of claim 21, wherein:
  forming the series of stadium openings in the upper elevations of the stack structure comprises forming, for each opposing pair of stadiums of the first series of stadiums and the second series of stadiums to be formed, multiple pairs of opposing staircases for each opposing pair of stadiums of the first series of stadiums and the second series of stadiums to be formed;
  forming the trench through the stack structure to the source/drain region comprises dividing the multiple pairs of opposing staircases into:
    a first group of multiple pairs of opposing staircases for each stadium of the first series of stadiums; and
    a second group of multiple pairs of opposing staircases for each stadium of the second series of stadiums; and
  extending the at least some of the stadium openings to the different elevations of the stack structure comprises extending the first group of multiple pairs of opposing staircases and the second group of multiple pairs of opposing staircases to the different elevations.

26. The method of claim 25, wherein forming, for each opposing pair of stadiums of the first series of stadiums and the second series of stadiums to be formed, multiple pairs of opposing staircases comprises forming two pairs of opposing staircases vertically offset from one another by a height of one of the tiers of the stack structure, the one of the tiers comprising one of the insulative structures and one of the other structures.

27. A method of forming a microelectronic device, the method comprising:
  forming, on a source/drain region, a stack structure comprising insulative structures vertically interleaved with other structures and arranged in tiers;
  forming, in upper elevations of the stack structure, a series of stadium openings defining opposing staircases, the opposing staircases of each stadium opening of the series having an elevational profile substantially the same as that of other opposing staircases of the stadium openings of the series;
  forming a trench vertically extending through additional elevations of the stack structure to the source/drain region, the trench horizontally extending in a lateral direction along the series of stadium openings to divide the series of stadium openings into a first series of staircased stadiums and a second series of staircased stadiums substantially symmetrically structured relative to the first series of staircased stadiums;
  extending at least some staircased stadiums of the first series and the second series to different depths in the stack, the at least some staircased stadiums substantially retaining the elevational profile of the opposing staircases after the extending;

while extending the at least some staircased stadiums, extending the trench to expose the source/drain region between the first series of staircased stadiums and the second series of staircased stadiums;

forming, in the trench, a series of conductive contact structures extending from the source/drain region;

forming a pair of slits vertically extending through the stack structure to the source/drain region below the stack structure, the pair of slits being substantially parallel to the trench with the trench disposed between a first slit structure and a second slit structure of the pair of slit structures, each slit of the pair of slits being spaced from a neighboring one of the first series of staircased stadiums and the second series of staircased stadiums by a bridge portion of the stack structure, the first series of staircased stadiums being defined in the stack structure between the first slit structure and the trench, and the second series of staircased stadiums being defined in the stack structure between the second slit structure and the trench, the staircased stadiums of the first series and of the second series individually comprising at least one set of steps ascending or descending in the lateral direction substantially parallel to the trench; and substantially replacing the other structures with conductive structures.

28. The method of claim 27, further comprising, after the replacing:

forming additional conductive contact structures extending to the conductive structures; and forming conductive routing lines operably connecting each of the additional conductive contact structures with one of the conductive contact structures in the trench.

29. An electronic system, comprising:
a three-dimensional memory device comprising:
  a stack structure comprising conductive structures vertically alternating with insulative structures and arranged in tiers;
  slit structures laterally and vertically extending through the stack structure to a source/drain region, the slit structures dividing the stack structure into dual-block structures, at least one of the dual-block structures comprising a pair of blocks defining a series of stadiums having opposing staircase structures, the series of stadiums of the pair of blocks being substantially symmetrically structured relative to one another about a trench laterally and vertically extending through the stack structure to the source/drain region, the stadiums of the series individually comprising at least one laterally ascending or laterally descending staircase; and
  a series of conductive contact structures in the trench and extending to the source/drain region;
at least one processor in operable communication with the three-dimensional memory device; and
at least one peripheral device in operable communication with the at least one processor.

* * * * *